United States Patent
Siebert et al.

(10) Patent No.: US 10,227,506 B2
(45) Date of Patent: Mar. 12, 2019

(54) CHEMICAL MECHANICAL POLISHING (CMP) COMPOSITION FOR HIGH EFFECTIVE POLISHING OF SUBSTRATES COMPRISING GERMANIUM

(71) Applicant: BASF SE, Ludwigshafen (DE)

(72) Inventors: Max Siebert, Ludwigshafen (DE); Michael Lauter, Mannheim (DE); Yongqing Lan, Ludwigshafen (DE); Robert Reichardt, Ludwigshafen am Rhein (DE); Alexandra Muench, Hassloch (DE); Manuel Six, Muehlhausen (DE); Gerald Daniel, Essingen (DE); Bastian Marten Noller, Neuhofen (DE); Kevin Huang, Hsinchu (TW); Sheik Ansar Usman Ibrahim, Heverlee (BE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 15/536,447

(22) PCT Filed: Dec. 4, 2015

(86) PCT No.: PCT/IB2015/059351
§ 371 (c)(1),
(2) Date: Jun. 15, 2017

(87) PCT Pub. No.: WO2016/097915
PCT Pub. Date: Jun. 23, 2016

(65) Prior Publication Data
US 2017/0369743 A1  Dec. 28, 2017

(30) Foreign Application Priority Data
Dec. 16, 2014 (EP) .................................. 14198297

(51) Int. Cl.
*C09G 1/04* (2006.01)
*C09G 1/02* (2006.01)
(Continued)

(52) U.S. Cl.
CPC ................. *C09G 1/04* (2013.01); *C09G 1/02* (2013.01); *C09K 13/00* (2013.01); *H01L 21/304* (2013.01); *H01L 21/461* (2013.01)

(58) Field of Classification Search
CPC .. C09G 1/04; C09G 1/02; C90K 13/00; H01L 21/304; H01L 21/461
See application file for complete search history.

(56) References Cited

U.S. PATENT DOCUMENTS

| 5,230,833 A | 7/1993 | Romberger et al. |
| 6,315,803 B1 | 11/2001 | Ina et al. |

(Continued)

FOREIGN PATENT DOCUMENTS

| CN | 101044600 A | 9/2007 |
| CN | 102131885 A | 7/2011 |

(Continued)

OTHER PUBLICATIONS

Extended Search Report issued in European Patent Application No. 14198297.5, dated May 27, 2015.
(Continued)

*Primary Examiner* — Duy Vu N Deo
(74) *Attorney, Agent, or Firm* — Oblon, McClelland, Maier & Neustadt, L.L.P.

(57) ABSTRACT

Disclosed herein is a chemical mechanical polishing (CMP) composition (Q) containing (A) inorganic particles, (B) a compound of general formula (I) below, and (C) an aqueous medium, in which the composition (Q) has a pH of from 2 to 6.

(Continued)

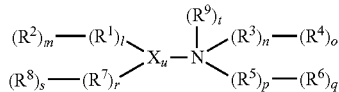

(I)

16 Claims, 2 Drawing Sheets

Figure 1:
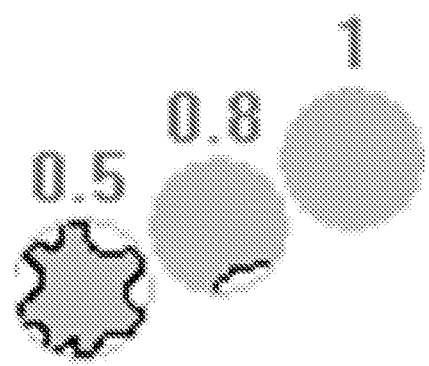

(51) Int. Cl.
  *C09K 13/00* (2006.01)
  *H01L 21/304* (2006.01)
  *H01L 21/461* (2006.01)

(56) References Cited

U.S. PATENT DOCUMENTS

| | | | | |
|---|---|---|---|---|
| 7,524,347 | B2* | 4/2009 | Sun | C09G 1/02 106/3 |
| 7,897,061 | B2 | 3/2011 | Dysard et al. | |
| 8,419,970 | B2* | 4/2013 | Kamimura | C09G 1/02 252/79.1 |
| 8,540,894 | B2 | 9/2013 | Matsushita et al. | |
| 2002/0081949 | A1 | 6/2002 | Yoshida et al. | |
| 2004/0102142 | A1 | 5/2004 | Yoshida et al. | |
| 2006/0117666 | A1 | 6/2006 | Yoshida et al. | |
| 2006/0278614 | A1 | 12/2006 | Wang et al. | |
| 2007/0251155 | A1 | 11/2007 | Dysard et al. | |
| 2008/0085663 | A1 | 4/2008 | Yoshida et al. | |
| 2008/0265375 | A1 | 10/2008 | Pietsch et al. | |
| 2009/0181539 | A1 | 7/2009 | Kon et al. | |
| 2009/0289033 | A1 | 11/2009 | Dysard et al. | |
| 2010/0009538 | A1 | 1/2010 | Kamimura | |
| 2011/0124195 | A1 | 5/2011 | Park et al. | |
| 2014/0004703 | A1 | 1/2014 | Noller et al. | |
| 2014/0170852 | A1* | 6/2014 | Noller | C09K 3/1463 438/692 |

FOREIGN PATENT DOCUMENTS

| | | | |
|---|---|---|---|
| CN | 103827235 | A | 5/2014 |
| CN | 103937414 | A | 7/2014 |
| EP | 1 085 067 | A1 | 3/2001 |
| EP | 1 865 546 | A1 | 12/2007 |
| EP | 2 063 461 | A1 | 5/2009 |
| WO | 2004/063301 | A1 | 7/2004 |
| WO | WO 2006/132905 | A2 | 12/2006 |
| WO | WO 2007/127121 | A1 | 11/2007 |
| WO | 2012/127398 | A1 | 9/2012 |
| WO | 2013/018015 | A2 | 2/2013 |
| WO | 2013/018016 | A2 | 2/2013 |
| WO | 2014/184708 | A2 | 11/2014 |

OTHER PUBLICATIONS

International Preliminary Report on Patentability dated Jun. 29, 2017 in Patent Application No. PCT/IB2015/059351.

Timo Kuntzsch, et al., "Characterization of Slurries Used for Chemical-Mechanical Polishing (CMP) in the Semiconductor Industry", Chemical Engineering & Technology, vol. 26, Issue 12 2003 pp. 1235-1239.

International Search Report and Written Opinion dated Mar. 24, 2016 in PCT/IB2015/059351 filed Dec. 4, 2015.

\* cited by examiner

CHEMICAL MECHANICAL POLISHING (CMP) COMPOSITION FOR HIGH EFFECTIVE POLISHING OF SUBSTRATES COMPRISING GERMANIUM

This invention is in the field of chemical mechanical polishing (also abbreviated as CMP in the following). More specifically it relates to a CMP composition for the polishing of germanium comprising substrates.

In the semiconductor industry, chemical mechanical polishing is a well-known technology applied in fabricating advanced photonic, microelectromechanical, and microelectronic materials and devices, such as semiconductor wafers.

During the fabrication of materials and devices used in the semiconductor industry, CMP is employed to planarize metal, semiconducting material and/or oxide surfaces.

CMP utilizes the interaction of chemical and mechanical action to achieve the planarity of the to-be-polished surfaces. Chemical action is provided by a chemical composition, also referred to as CMP composition or CMP slurry. A variety of different chemical additives can be used during planarization. Oxidizers are applied to oxidize the metal-/semimetal surface to alleviate the material removal. On the other hand a controllable material removal is aimed at. The material removal shall proceed controlled mechanically and not by isotropic chemical etching. To avoid or minimize said isotropic chemical etching, etching/corrosion inhibitors can be added to the CMP composition. For example in the field of copper CMP triazoles and benzotriazoles as corrosion inhibitors are well described in the art.

Mechanical action is usually carried out by a polishing pad which is typically pressed onto the to-be-polished surface and mounted on a moveable platen. During the polishing action the platen is moved. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, CMP compositions comprising abrasive particles, an additive and water, wherein the CMP compositions have an acidic pH and were used for the polishing of metal containing surfaces are known and described for instance, in the following references.

U.S. Pat. No. 7,897,061 B2 discloses a chemical-mechanical polishing (CMP) composition for polishing a phase change alloy-containing substrate. Said composition comprises a particulate abrasive material in an amount of not more than about three percent by weight and at least one chelating agent.

WO 2013/018015 discloses a process for the manufacture of semiconductor devices comprising the chemical mechanical polishing of elemental germanium and/or $Si_{1-x}Ge_x$ material in the presence of a chemical mechanical polishing (CMP) composition which comprises inorganic particles, organic particles, or a mixture or composite thereof. In addition to an oxidizing agent at least one type of an organic compound is comprised.

WO 2013/018016 discloses a process for the manufacture of semiconductor devices comprising the chemical mechanical polishing of elemental germanium and/or $Si_{1-x}Ge_x$ material in the presence of a chemical mechanical polishing (CMP) composition having a pH value in the range of from 3.0 to 5.5. In addition to silica particles hydrogen peroxide as oxidizing agent is comprised in the examples.

U.S. Pat. No. 8,540,894 B2 discloses a polishing composition consisting essentially of a pH regulator, a water-soluble polymer compound, and a compound containing an alkylene diamine structure having two nitrogens and having at least one block type polyether bonded to at least one of the two nitrogens of the alkylene structure, the block type polyether having a band of an oxyethylene group and an oxypropylene group. By containing such a compound, foaming of the polishing composition is suppressed by defoamability, and additionally surface properties particularly after polishing, such as light point defects and surface fog, can be improved.

One of the objects of the present invention was to provide a CMP composition. In particular a CMP composition was sought showing an improved etching behavior combined with an effective polishing performance, especially
(i) a high material removal rate (MRR) of the substrate to be preferably polished, for example elemental germanium
(ii) a high selectivity of germanium and/or $Si_{1-x}Ge_x$ to silicon dioxide (Ge and/or $Si_{1-x}Ge_x$:$SiO_2$ selectivity)
(iii) a low static etching rate (SER) of germanium and/or $Si_{1-x}Ge_x$,
(iv) the combination of (i), (ii), (iii).

Furthermore, a CMP composition was aimed at which is a stable formulation or dispersion.

A further object of the present invention was to provide a CMP process appropriate for the chemical-mechanical polishing of substrates comprising elemental germanium or $Si_{1-x}Ge_x$ with $0.1 \leq x < 1$.

Moreover, a CMP process was sought that is easy to apply and requires as few steps as possible.

Accordingly, a chemical mechanical polishing (CMP) composition (Q) was found comprising
(A) inorganic particles,
(B) a compound of general formula (I)

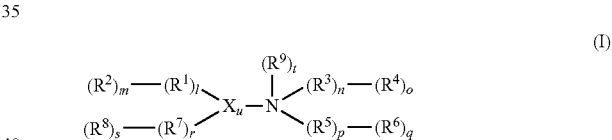

and wherein the indices and the variables have the following meaning:
X is $CH_2N$, $CH_2CH_2N$, $CH_2CH_2CH_2N$, $CH_2CH_2CH_2CH_2N$, $CH$, $CH_2$, $CH_2CH$, $CH_2CH_2CH$, $C=O$ or $CH_2CH_2O$ wherein X is bonded by the carbon atom of the respective group to the nitrogen
$R_1$, $R_2$, $R_3$, $R_4$, $R_5$, $R_6$, $R_7$, $R_8$ and $R_9$ are independently from each other $O^-$, H, OH, $COO^-$, COONa, CH, $CH_2$, $CH_3$, $CH_2CH_3$, $C_1$-$C_{20}$-alkyl, $C_2$-$C_{20}$-alkenyl with at least one carbon carbon double bond, $C_1$-$C_{20}$-alkyl-acyl, $C_2$-$C_{20}$-alkenyl-acyl, $CH_2CH_2OH$, OHCHCHOH, $CH_2COO^-$, $CH_2COONa$, $CH_2CH_2O$ or $CH_2CH(CH_3)O$,
u and t are 0 or 1,
l, m, o, q, and s are an integer within a range of from 0 to 5 and n, p and r are an integer within a range of from 1 to 5 for a compound according to formula (I) having no polymeric polyether chain in the structure
l, m, o, q and s are an integer within a range of from 0 to 500 and n, p and r are an integer within a range of from 1 to 500 for a compound according to formula (I) having at least one polymeric polyether chain in the structure
when u is at least one and X is $C=O$ or $CH_2CH_2O$, then l or r are zero or l and r are zero, when u is one and X is CH$_2$N, CH$_2$CH$_2$N, CH$_2$CH$_2$CH$_2$N, CH$_2$CH$_2$CH$_2$CH$_2$N, CH, CH$_2$, CH$_2$CH, CH$_2$CH$_2$CH, then l or r are at least one or l and r are at least one, or a salt thereof, (C) an aqueous medium wherein the composition (Q) has a pH of from 2 to 6.

Moreover, the use of the CMP composition (Q) for chemical mechanical polishing of substrates (S) which are used in the semiconductor industry was found, which fulfills the objects of the invention, wherein the substrate (S) comprises (i) elemental germanium or (ii) Si$_{1-x}$Ge$_x$ with 0.1≤x<1.

Further, a process for the manufacture of a semiconductor device comprising the chemical-mechanical polishing of a substrate (S) used in the semiconductor industry in the presence of the CMP composition (Q) was found, which fulfills the objects of the invention, wherein the substrate (S) comprises (i) elemental germanium or (ii) Si$_{1-x}$Ge$_x$ with 0.1≤x<1.

Preferred embodiments are explained in the claims and the specification. It is understood that combinations of preferred embodiments are within the scope of the present invention.

According to the invention, the CMP composition comprises inorganic particles (A).

(A) can be
  inorganic particles such as a metal, a metal oxide or carbide, including a metalloid, a metalloid oxide or carbide, or
  a mixture of inorganic particles.

Generally, the chemical nature of particles (A) is not particularly limited. (A) may be of the same chemical nature or a mixture of particles of different chemical nature. As a rule, particles (A) of the same chemical nature are preferred.

Generally, (A) can be
  of one type of colloidal inorganic particles,
  of one type of fumed inorganic particles,
  a mixture of different types of colloidal and/or fumed inorganic particles, Generally, colloidal inorganic particles are inorganic particles which are produced by a wet precipitation or condensation process; fumed inorganic particles are produced by high temperature flame hydrolysis of for example metal chloride precursor with hydrogen in the presence of oxygen, for example using the Aerosil® process.

Preferably, inorganic particles (A) are colloidal or fumed inorganic particles or a mixture thereof. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. Most preferably, particles (A) are alumina, ceria, silica, titania, zirconia, or mixtures or composites thereof. In particular, (A) are silica particles. For example, (A) are colloidal silica particles.

As used herein, the term "colloidal silica" refers to silicon dioxide that has been prepared by condensation polymerization of Si(OH)$_4$. The precursor Si(OH)$_4$ can be obtained, for example, by hydrolysis of high purity alkoxysilanes, or by acidification of aqueous silicate solutions. Such colloidal silica can be prepared in accordance with U.S. Pat. No. 5,230,833 or can be obtained as any of various commercially available products, such as the Fuso PL-1, PL-2, and PL-3 products, and the Nalco 1050, 2327 and 2329 products, as well as other similar products available from DuPont, Bayer, Applied Research, Nissan Chemical, Nyacol and Clariant.

Preferably the amount of (A) in the CMP composition (Q) is not more than 10 wt. %, more preferably not more than 5.0 wt. %, most preferably not more than 3.0 wt. %, particularly not more than 2.5 wt. %, based on the total weight of the composition (Q). Preferably, the amount of (A) is at least 0.05 wt. %, more preferably at least 0.1 wt. %, most preferably at least 0.5 wt. %, particularly at least 0.8 wt. %, based on the total weight of the composition (Q). For example the amount of (A) can be in the range of from 0.08 wt. % to 3.2 wt. %.

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The mean particle size of the particles (A) can vary within a wide range. The mean particle size is the d$_{50}$ value of the particle size distribution of (A) in the aqueous medium (M) and can be measured for example using dynamic light scattering (DLS) or static light scattering (SLS) methods. These and other methods are well known in the art, see e.g. Kuntzsch, Timo; Witnik, Ulrike; Hollatz, Michael Stintz; Ripperger, Siegfried; Characterization of Slurries Used for Chemical-Mechanical Polishing (CMP) in the Semiconductor Industry; Chem. Eng. Technol; 26 (2003), volume 12, page 1235.

For DLS, typically a Malvern Zetasizer Nano S (DLS, dynamic light scattering measurement according to manual) or any other such instrument is used. This technique measures the hydrodynamic diameter of the particles as they scatter a laser light source (λ=650 nm), detected at an angle of 90° or 173° to the incoming light. Variations in the intensity of the scattered light are due to the random Brownian motion of the particles as they move through the incident beam and are monitored as a function of time. Autocorrelation functions performed by the instrument as a function of delay time are used to extract decay constants; smaller particles move with higher velocity through the incident beam and correspond to faster decays.

These decay constants are proportional to the diffusion coefficient, D$_t$, of the particle and are used to calculate particle size (diameter) D$_h$ according to the Stokes-Einstein equation:

$$D_h = \frac{k_B T}{3\pi \eta D_t}$$

where the suspended particles are assumed to (1) have a spherical morphology and (2) be uniformly dispersed (i.e. not agglomerated) throughout the aqueous medium (M). This relationship is expected to hold true for particle dispersions that contain lower than 1% by weight of solids as there are no significant deviations in the viscosity η of the aqueous dispersant (M), in which η=0.96 mPa·s (at Temperature T=22° C.). The particle size distribution of the inorganic particle (A) dispersion is usually measured in a plastic cuvette at 0.1 to 1.0% solid concentration and dilution, if necessary, is carried out with the dispersion medium or ultra-pure water.

Preferably, the mean particle size of the particles (A) is in the range of from 20 to 200 nm, more preferably in the range of from 25 to 180 nm, most preferably in the range of from 30 to 170 nm, particularly preferably in the range of from 40 to 160 nm, and in particular in the range of from 45 to 150 nm, as measured with dynamic light scattering techniques using instruments for example a High Performance Particle Sizer for example Zetasizer Nano S from Malvern Instruments, Ltd. or Horiba LB550.

The BET surface determined according to DIN ISO 9277:2010-09 of the particles (A) can vary within a wide range. Preferably, the BET surface of the particles (A) is in the range of from 1 to 500 m$^2$/g, more preferably in the range of from 5 to 250 m$^2$/g, most preferably in the range of from 10 to 100 m$^2$/g, in particular in the range of from 20 to 90 m$^2$/g, for example in the range of from 25 to 85 m$^2$/g.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of cubes, cubes with bevelled edges, octahedrons, icosahedrons, cocoons, nodules or spheres with or without protrusions or indentations. Preferably, they are essentially spherical, whereby typically these have protrusions or indentations.

According to another embodiment, the inorganic particles (A) are preferably cocoon-shaped. The cocoons may be with or without protrusions or indentations. Cocoon-shaped particles are particles with a minor axis of from 10 to 200 nm, a ratio of major/minor axis of 1.4 to 2.2, more preferably of 1.6 to 2.0. Preferably they have an averaged shape factor of from 0.7 to 0.97, more preferably of from 0.77 to 0.92, preferably an averaged sphericity of from 0.4 to 0.9, more preferably of from 0.5 to 0.7 and preferably an averaged equivalent circle diameter of from 41 to 66 nm, more preferably of from 48 to 60 nm, which can be determined by transmission electron microscopy and scanning electron microscopy.

The determination of the shape factor, the sphericity and the equivalent circle diameter of cocoon-shaped particles is explained hereinbelow with reference to FIGS. 1 to 4.

The shape factor gives information on the shape and the indentations of an individual particle (see FIG. 1) and can be calculated according to the following formula:

$$\text{shape factor} = 4\pi(\text{area}/\text{perimeter}^2)$$

The shape factor of a spheric particle without indentations is 1. The value of shape factor decreases when the number of indentations increases.

The sphericity (see FIG. 2) gives information on the elongation of an individual particle using the moment about the mean and can be calculated according to the following formula wherein M are the centres of gravity of the respective particle:

$$\text{sphericity} = (M_{xx} - M_{yy}) - [4M_{xy}^2 + (M_{yy} - M_{xx})^2]^{0.5}/(M_{xx} - M_{yy}) + [4M_{xy}^2 + (M_{yy} - M_{xx})^2]^{0.5}$$

$$\text{elongation} = (1/\text{sphericity})^{0.5}$$

wherein
$M_{xx} = \Sigma(x - x_{mean})^2/N$
$M_{yy} = \Sigma(y - y_{mean})^2/N$
$M_{xy} = \Sigma[(x - x_{mean})*(y - y_{mean})]/N$
N number of pixels forming the image of the respective particle
x, y coordinates of the pixels
$x_{mean}$ mean value of the x coordinates of the N pixels forming the image of said particle
$y_{mean}$ mean value of the y coordinates of the N pixels forming the image of said particle The sphericity of a spheric particle is 1. The value of the sphericity decreases when particles are elongated.

Figure 3:
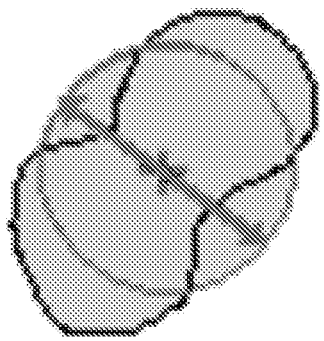

The equivalent circle diameter (also abbreviated as ECD in the following) of an individual non-circular particle gives information on the diameter of a circle which has the same area as the respective non-circular particle (see FIG. 3).

The averaged shape factor, averaged sphericity and averaged ECD are the arithmetic averages of the respective property related to the analyzed number of particles.

The procedure for particle shape characterization is as follows. An aqueous cocoon-shaped silica particle dispersion with 20 wt. % solid content is dispersed on a carbon foil and is dried. The dried dispersion is analyzed by using Energy Filtered-Transmission Electron Microscopy (EF-TEM) (120 kilo volts) and Scanning Electron Microscopy secondary electron image (SEM-SE) (5 kilo volts). The EF-TEM image (see FIG. 4) having a resolution of 2 k, 16 Bit, 0.6851 nm/pixel is used for the analysis. The images are binary coded using the threshold after noise suppression. Afterwards the particles are manually separated. Overlying and edge particles are discriminated and not used for the analysis. ECD, shape factor and sphericity as defined before are calculated and statistically classified.

For example, cocoon-shaped particles are FUSO PL-3 manufactured by Fuso Chemical Corporation having an average primary particle size (d1) of 35 nm and an average secondary particle size (d2) of 70 nm.

The organic moieties mentioned in the definition of the variables $R^1$, $R^2$, $R^3$, $R^4$, $R^5$, $R^6$, $R^7$, $R^8$ and $R^9$ are—terms for individual enumerations of the individual group members. All hydrocarbon chains, i.e. all alkyl or alkenyl or alkyl-acyl or alkenyl-acyl can be straight-chain or branched, the prefix $C_n$-$C_m$ denoting in each case the possible number of carbon atoms in the group. It is to be understood that $C_n$-$C_m$ is not restricted to the members with m and n but also includes all integer between n and m, example of such meanings are:

$C_1$-$C_{20}$-alkyl for example $CH_3$, $C_2H_5$, $C_3H_7$, $C_4H_9$, $C_5H_{11}$, $C_6H_{13}$, $C_7H_{15}$, $C_8H_{17}$, $C_9H_{19}$, $C_{10}H_{21}$, $C_{11}H_{23}$, $C_{12}H_{25}$, $C_{13}H_{27}$, $C_{14}H_{29}$, $C_{15}H_{31}$, $C_{16}H_{33}$, $C_{17}H_{35}$, $C_{18}H_{37}$, $C_{19}H_{39}$, $C_{20}H_{41}$.

$C_2$-$C_{20}$-alkenyl for example $C_2H_3$, $C_3H_5$, $C_4H_7$, $C_5H_9$, $C_6H_{11}$, $C_7H_{13}$, $C_8H_{15}$, $C_9H_{17}$, $C_{10}H_{19}$, $C_{11}H_{21}$, $C_{12}H_{23}$, $C_{13}H_{25}$, $C_{14}H_{27}$, $C_{15}H_{29}$, $C_{16}H_{31}$, $C_{17}H_{33}$, $C_{18}H_{35}$, $C_{19}H_{37}$, $C_{20}H_{39}$.

$C_1$-$C_{20}$-alkyl-acyl for example $CH_2$-acyl, $C_2H_4$-acyl, $C_3H$-acyl, $C_4H_7$-acyl, $C_5H_{10}$-acyl, $CH_{12}$-acyl, $C_7H_{14}$-acyl, $C_8H_{16}$-acyl, $C_9H_{18}$-acyl, $C_{10}H_{20}$-acyl, $C_{11}H_{22}$-acyl, $C_{12}H_{24}$-acyl, $C_{13}H_{26}$-acyl, $C_{14}H_{28}$-acyl, $C_{15}H_{30}$-acyl, $C_{16}H_{32}$-acyl, $C_{17}H_{34}$-acyl, $C_{18}H_{36}$-acyl, $C_{19}H_{38}$-acyl, $C_{20}H_{40}$-acyl.

$C_2$-$C_{20}$-alkenyl-acyl for example $C_2H_2$-acyl, $C_3H_4$-acyl, $C_4H_6$-acyl, $C_5H_8$-acyl, $C_6H_{10}$-acyl, $C_7H_{12}$-acyl, $C_8H_{14}$-acyl, $C_9H_{16}$-acyl, $C_{10}H_{18}$-acyl, $C_{11}H_{20}$-acyl, $C_{12}H_{22}$-acyl, $C_{13}H_{24}$-acyl, $C_{14}H_{26}$-acyl, $C_{15}H_{28}$-acyl, $C_1H_{30}$-acyl, $C_{17}H_{32}$-acyl, $C_{18}H_{34}$-acyl, $C_{19}H_{36}$-acyl, $C_{20}H_{38}$-acyl.

According to the invention, the CMP composition comprises at least one compound (B) of general formula (I).

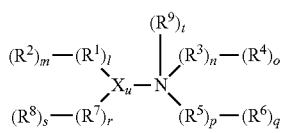
                                                        (I)

R¹ may preferably be O⁻, H, OH, COO⁻, COONa, CH, CH$_2$, CH$_3$, CH$_2$CH$_3$, C$_1$-C$_{20}$-alkyl, C$_2$-C$_{20}$-alkenyl with at least one carbon carbon double bond, C$_1$-C$_{20}$-alkyl-acyl, C$_2$-C$_{20}$-alkenyl-acyl, CH$_2$CH$_2$OH, OHCHCHOH, CH$_2$COO⁻, CH$_2$COONa, CH$_2$CH$_2$O or CH$_2$CH(CH$_3$)O, more preferably R¹ may be H, OH, CH, CH$_2$, CH$_3$, CH$_2$CH$_3$, C$_5$-C$_{18}$-alkyl, C$_5$-C$_{18}$-alkenyl with at least one carbon carbon double bond, C$_5$-C$_{18}$-alkyl-acyl, C$_5$-C$_{18}$-alkenyl-acyl, CH$_2$CH$_2$OH, CH$_2$COO⁻, CH$_2$CH$_2$O or CH$_2$CH(CH$_3$)O, most preferably R¹ may be H, CH, CH$_2$, CH$_3$, CH$_2$CH$_3$, C$_8$-C$_{16}$-alkyl, C$_8$-C$_{16}$-alkenyl with at least one carbon carbon double bond, C$_8$-C$_{16}$-alkyl-acyl, C$_8$-C$_{16}$-alkenyl-acyl, CH$_2$CH$_2$OH, CH$_2$COO⁻, CH$_2$CH$_2$O or CH$_2$CH(CH$_3$)O, particular preferably R¹ may be H, CH$_2$, C$_8$-C$_{16}$-alkyl, C$_8$-C$_{16}$-alkenyl with at least one carbon carbon double bond, CH$_2$CH$_2$O or CH$_2$CH(CH$_3$)O.

R² may preferably be O⁻, H, OH, COO⁻, COONa, CH, CH$_2$, CH$_3$, CH$_2$CH$_3$, C$_1$-C$_{20}$-alkyl, C$_2$-C$_{20}$-alkenyl with at least one carbon carbon double bond, C$_1$-C$_{20}$-alkyl-acyl, C$_2$-C$_{20}$-alkenyl-acyl, CH$_2$CH$_2$OH, OHCHCHOH, CH$_2$COO⁻, CH$_2$COONa, CH$_2$CH$_2$O or CH$_2$CH(CH$_3$)O, more preferably R² may be H, OH, CH$_3$, CH$_2$CH$_3$, C$_5$-C$_{18}$-alkyl, C$_5$-C$_{18}$-alkenyl with at least one carbon carbon double bond, C$_5$-C$_{18}$-alkyl-acyl, C$_5$-C$_{18}$-alkenyl-acyl, CH$_2$CH$_2$OH, CH$_2$COO⁻, CH$_2$CH$_2$O or CH$_2$CH(CH$_3$)O, most preferably R² may be H, OH, CH$_3$, CH$_2$CH$_3$, C$_5$-C$_{18}$-alkyl, C$_5$-C$_{18}$-alkenyl with at least one carbon carbon double bond, CH$_2$CH$_2$OH, CH$_2$CH$_2$O or CH$_2$CH(CH$_3$)O, particular preferably R² may be H, OH, CH$_2$CH$_2$OH, CH$_2$CH$_2$O or CH$_2$CH(CH$_3$)O.

R³ may preferably be O⁻, H, OH, COO⁻, COONa, CH, CH$_2$, CH$_3$, CH$_2$CH$_3$, C$_1$-C$_{20}$-alkyl, C$_2$-C$_{20}$-alkenyl with at least one carbon carbon double bond, C$_1$-C$_{20}$-alkyl-acyl, C$_2$-C$_{20}$-alkenyl-acyl, CH$_2$CH$_2$OH, OHCHCHOH, CH$_2$COO⁻, CH$_2$COONa, CH$_2$CH$_2$O or CH$_2$CH(CH$_3$)O, more preferably R³ may be H, OH, CH, CH$_2$, CH$_3$, CH$_2$CH$_3$, C$_5$-C$_{18}$-alkyl, C$_5$-C$_{18}$-alkenyl with at least one carbon carbon double bond, C$_5$-C$_{18}$-alkyl-acyl, C$_5$-C$_{18}$-alkenyl-acyl, CH$_2$CH$_2$OH, CH$_2$COO⁻, CH$_2$CH$_2$O or CH$_2$CH(CH$_3$)O, most preferably R³ may be H, CH, CH$_2$, CH$_3$, CH$_2$CH$_3$, C$_8$-C$_{16}$-alkyl, C$_8$-C$_{16}$-alkenyl with at least one carbon carbon double bond, CH$_2$CH$_2$OH, CH$_2$CH$_2$O or CH$_2$CH(CH$_3$)O, particular preferably R³ may be H, CH$_2$, CH$_3$, CH$_2$CH$_2$O or CH$_2$CH(CH$_3$)O.

R⁴ may preferably be O⁻, H, OH, COO⁻, COONa, CH, CH$_2$, CH$_3$, CH$_2$CH$_3$, C$_1$-C$_{20}$-alkyl, C$_2$-C$_{20}$-alkenyl with at least one carbon carbon double bond, C$_1$-C$_{20}$-alkyl-acyl, C$_2$-C$_{20}$-alkenyl-acyl, CH$_2$CH$_2$OH, OHCHCHOH, CH$_2$COO⁻, CH$_2$COONa, CH$_2$CH$_2$O or CH$_2$CH(CH$_3$)O, more preferably R⁴ may be H, OH, COONa, CH$_2$, CH$_3$, C$_5$-C$_{18}$-alkyl, C$_5$-C$_{18}$-alkenyl with at least one carbon carbon double bond, C$_5$-C$_{18}$-alkyl-acyl, C$_5$-C$_{18}$-alkenyl-acyl, CH$_2$CH$_2$OH, CH$_2$COO⁻, CH$_2$COONa, CH$_2$CH$_2$O or CH$_2$CH(CH$_3$)O, most preferably R⁴ may be H, OH, C$_8$-C$_{16}$-alkyl, C$_8$-C$_{18}$-alkenyl with at least one carbon carbon double bond, C$_8$-C$_{16}$-alkyl-acyl, C$_8$-C$_{16}$-alkenyl-acyl, CH$_2$CH$_2$OH, CH$_2$COO⁻, CH$_2$COONa, CH$_2$CH$_2$O or CH$_2$CH(CH$_3$)O, particular preferably R⁴ may be H, OH, C$_8$-C$_{16}$-alkyl, C$_8$-C$_{16}$-alkenyl with at least one carbon carbon double bond, C$_8$-C$_{16}$-alkyl-acyl, C$_8$-C$_{16}$-alkenyl-acyl, CH$_2$COONa, CH$_2$CH$_2$O or CH$_2$CH(CH$_3$)O, R⁵ may preferably be O⁻, H, OH, COO⁻, COONa, CH, CH$_2$, CH$_3$, CH$_2$CH$_3$, C$_1$-C$_{20}$-alkyl, C$_2$-C$_{20}$-alkenyl with at least one carbon carbon double bond, C$_1$-C$_{20}$-alkyl-acyl, C$_2$-C$_{20}$-alkenyl-acyl, CH$_2$CH$_2$OH, OHCHCHOH, CH$_2$COO⁻, CH$_2$COONa, CH$_2$CH$_2$O or CH$_2$CH(CH$_3$)O, more preferably R⁵ may be H, OH, COO⁻, COONa, CH, CH$_2$, CH$_3$, CH$_2$CH$_3$, C$_5$-C$_{18}$-alkyl, C$_5$-C$_{18}$-alkenyl with at least one carbon carbon double bond, C$_5$-C$_{18}$-alkyl-acyl, C$_5$-C$_{18}$-alkenyl-acyl, CH$_2$CH$_2$OH, CH$_2$COO⁻, CH$_2$COONa, CH$_2$CH$_2$O or CH$_2$CH(CH$_3$)O, most preferably R⁵ may be H, COO⁻, COONa, CH$_2$, CH$_3$, C$_8$-C$_{16}$-alkyl, C$_8$-C$_{16}$-alkenyl with at least one carbon carbon double bond, CH$_2$CH$_2$OH, CH$_2$COO⁻, CH$_2$COONa, CH$_2$CH$_2$O or CH$_2$CH(CH$_3$)O, particular preferably R⁵ may be H, CH$_2$, CH$_3$, CH$_2$COO⁻, CH$_2$COONa, CH$_2$CH$_2$O or CH$_2$CH(CH$_3$)O.

R⁶ may preferably be O⁻, H, OH, COO⁻, COONa, CH, CH$_2$, CH$_3$, CH$_2$CH$_3$, C$_1$-C$_{20}$-alkyl, C$_2$-C$_{20}$-alkenyl with at least one carbon carbon double bond, C$_1$-C$_{20}$-alkyl-acyl, C$_2$-C$_{20}$-alkenyl-acyl, CH$_2$CH$_2$OH, OHCHCHOH, CH$_2$COO⁻, CH$_2$COONa, CH$_2$CH$_2$O or CH$_2$CH(CH$_3$)O, more preferably R⁶ may be H, OH, COO⁻, CH$_3$, CH$_2$CH$_3$, C$_5$-C$_{18}$-alkyl, C$_5$-C$_{18}$-alkenyl with at least one carbon carbon double bond, C$_5$-C$_{18}$-alkyl-acyl, C$_5$-C$_{18}$-alkenyl-acyl, CH$_2$CH$_2$OH, CH$_2$COO⁻, CH$_2$CH$_2$O or CH$_2$CH(CH$_3$)O, most preferably R⁶ may be H, OH, CH$_3$, CH$_2$CH$_3$, C$_8$-C$_{16}$-alkyl, C$_8$-C$_{16}$-alkenyl with at least one carbon carbon double bond, C$_8$-C$_{16}$-alkyl-acyl, C$_8$-C$_{16}$-alkenyl-acyl, CH$_2$CH$_2$OH, CH$_2$CH$_2$O or CH$_2$CH(CH$_3$)O, particular preferably R⁶ may be H, OH, C$_8$-C$_{16}$-alkyl, C$_8$-C$_{16}$-alkenyl with at least one carbon carbon double bond, C$_8$-C$_{18}$-alkyl-acyl, C$_8$-C$_{16}$-alkenyl-acyl, CH$_2$CH$_2$OH, CH$_2$CH$_2$O or CH$_2$CH(CH$_3$)O, R⁷ may preferably be O⁻, H, OH, COO⁻, COONa, CH, CH$_2$, CH$_3$, CH$_2$CH$_3$, C$_1$-C$_{20}$-alkyl, C$_2$-C$_{20}$-alkenyl with at least one carbon carbon double bond, C$_1$-C$_{20}$-alkyl-acyl, C$_2$-C$_{20}$-alkenyl-acyl, CH$_2$CH$_2$OH, OHCHCHOH, CH$_2$COO⁻, CH$_2$COONa, CH$_2$CH$_2$O or CH$_2$CH(CH$_3$)O, more preferably R⁷ may be H, OH, COO⁻, CH, CH$_2$, C$_1$-C$_{20}$-alkyl, C$_2$-C$_{20}$-alkenyl with at least one carbon carbon double bond, C$_1$-C$_{20}$-alkyl-acyl, C$_2$-C$_{20}$-alkenyl-acyl, OHCHCHOH, CH$_2$COO⁻, CH$_2$CH$_2$O or CH$_2$CH(CH$_3$)O, most preferably R⁷ may be H, OH, CH, CH$_2$, C$_1$-C$_{20}$-alkyl, C$_2$-C$_{20}$-alkenyl with at least one carbon carbon double bond, C$_1$-C$_{20}$-alkyl-acyl, C$_2$-C$_{20}$-alkenyl-acyl, OHCHCHOH, CH$_2$CH$_2$O or CH$_2$CH(CH$_3$)O, particular preferably R⁷ may be H, OH, C$_8$-C$_{16}$-alkyl, C$_8$-C$_{16}$-alkenyl with at least one carbon carbon double bond, C$_8$-C$_{16}$-alkyl-acyl, C$_8$-C$_{16}$-alkenyl-acyl, OHCHCHOH, CH$_2$CH$_2$O or CH$_2$CH(CH$_3$)O.

R⁸ may preferably be O⁻, H, OH, COO⁻, COONa, CH, CH$_2$, CH$_3$, CH$_2$CH$_3$, C$_1$-C$_{20}$-alkyl, C$_2$-C$_{20}$-alkenyl with at least one carbon carbon double bond, C$_1$-C$_{20}$-alkyl-acyl, C$_1$-C$_{20}$-alkenyl-acyl, CH$_2$CH$_2$OH, OHCHCHOH, CH$_2$COO⁻, CH$_2$COONa, CH$_2$CH$_2$O or CH$_2$CH(CH$_3$)O, more preferably R⁸ may be H, OH, C$_1$-C$_{20}$-alkyl, C$_2$-C$_{20}$-alkenyl with at least one carbon carbon double bond, C$_1$-C$_{20}$-alkyl-acyl, C$_2$-C$_{20}$-alkenyl-acyl, CH$_2$COO⁻, CH$_2$CH$_2$O or CH$_2$CH(CH$_3$)O, most preferably $R^8$ may be H, OH, $C_1$-$C_{20}$-alkyl, $C_2$-$C_{20}$-alkenyl with at least one carbon carbon double bond, $CH_2CH_2O$ or $CH_2CH(CH_3)O$, particular preferably $R^8$ may be H, $C_4$-$C_{18}$-alkyl, $C_4$-$C_{18}$-alkenyl with at least one carbon carbon double bond, $CH_2CH_2O$ or $CH_2CH(CH_3)O$.

$R^9$ may preferably be $O^-$, H, OH, $COO^-$, COONa, CH, $CH_2$, $CH_3$, $CH_2CH_3$, $C_1$-$C_{20}$-alkyl, $C_2$-$C_{20}$-alkenyl with at least one carbon carbon double bond, $C_1$-$C_{20}$-alkyl-acyl, $C_1$-$C_{20}$-alkenyl-acyl, $CH_2CH_2OH$, OHCHCHOH, $CH_2COO^-$, $CH_2COONa$, $CH_2CH_2O$ or $CH_2CH(CH_3)O$, more preferably $R^9$ may be $O^-$, H, OH, $CH_3$, $CH_2CH_3$ or $CH_2COO^-$, most preferably $R^9$ may be $O^-$, $CH_3$, $CH_2CH_3$ or $CH_2COO^-$, particular preferably $R^9$ may be $O^-$, $CH_3$ or $CH_2CH_3$.

X preferably may be $CH_2N$, $CH_2CH_2N$, $CH_2CH_2CH_2N$, $CH_2CH_2CH_2CH_2N$, CH, $CH_2$, $CH_2CH$, $CH_2CH_2CH$, C=O or $CH_2CH_2O$, more preferably X may be $CH_2CH_2N$, $CH_2CH_2CH_2N$, $CH_2CH_2CH_2CH_2N$, CH, $CH_2$, $CH_2CH$, $CH_2CH_2CH$, C=O or $CH_2CH_2O$, most preferably X may be $CH_2CH_2N$, $CH_2CH_2CH_2N$, CH, $CH_2CH$, $CH_2CH_2CH$, C=O or $CH_2CH_2O$, particular preferably X may be $CH_2CH_2N$, $CH_2CH_2CH_2N$, CH, $CH_2CH$, C=O or $CH_2CH_2O$, l, m, n, o, p, q, r and s preferably may be a integer of from 0 to 5, more preferably l, m, n, o, p, q, r and s may be a integer of from 0 to 4, most preferably l, m, n, o, p, q, r and s may be a integer of from 0 to 3, particular preferably l, m, n, o, p, q, r and s may be a integer of from 0 to 2, for example 1, for a compound (B) according to formula (I) having no polymeric polyether chain in the structure.

l, m, n, o, p, q, r and s preferably may be a integer of from 0 to 500, more preferably l, m, n, o, p, q, r and s may be a integer of from 0 to 300, most preferably l, m, n, o, p, q, r and s may be a integer of from 0 to 200, particular preferably l, m, n, o, p, q, r and s may be a integer of from 0 to 100, for example 4, 6, 8, 10, 13, 17, 22, 25, 29, 33, 35, 37, 41, 47, 50, 54, 58, 62, 67, 71, 73, 78, 81, 84, 85, 87, 91, 95 or 97 for a compound (B) according to formula (I) having at least one polymeric polyether chain in the structure.

When $R^1$, $R^3$, $R^5$ and/or $R^7$ of general formula (I) are independently from each other a monovalent substituent, m, o, q and/or s are zero, which means that if $R^1$ is monovalent m is zero, when $R^3$ is monovalent o is zero, when $R^5$ is monovalent q is zero and when R7 is monovalent s is zero. When $R^1$, $R^3$, $R^5$ and/or $R^7$ are independently from each other a divalent substituent m, o, q and/or s are at least one, which means that if $R^1$ is divalent m is at least one, when $R^3$ is divalent o is at least one, when $R^5$ is divalent q is at least one and when R7 is divalent s is at least one.

In the context of the present invention a monovalent substituent is a substituent which can form one additional covalent chemical bond other than an oxygen hydrogen bond, monovalent substituents may be $O^-$, H, OH, $COO^-$, COONa, $CH_3$, $CH_2CH_3$, $C_1$-$C_{20}$-alkyl, $C_2$-$C_2$-alkenyl with at least one carbon carbon double bond, $C_1$-$C_{20}$-alkyl-acyl, $C_2$-$C_{20}$-alkenyl-acyl, $CH_2CH_2OH$, $CH_2COO^-$ or $CH_2COONa$.

In the context of the present invention a divalent substituent is a substituent which can form at least two additional covalent chemical bonds, divalent substituents may be CH, $CH_2$, HOCHCHOH, $CH_2CH_2O$ or $CH_2CH(CH_3)O$.

Generally, compound (B) may be a molecule with at least one non-polymeric side chain or a molecule with at least one polymeric side chain. If the side chain of compound (B) is a polymeric side chain it is preferably at least one polyether side chain wherein the terminal oxyalkylene group of the at least one polyether side chain has a hydroxy function. For example the terminal oxyethylene group of the at least one polymeric polyether side chain in compound (B) has a hydroxyl function or the terminal oxypropylene group of the at least one polymeric polyether side chain in compound (B) has a hydroxyl function. Generally the at least one polyether side chain may be linear or branched, the oxyalkylene groups forming the at least one polymeric polyether side chain in compound (B) may have a random, alternating, gradient and/or block like distribution in the polymeric polyether side chain.

Preferably the mass ratio between the oxyethylene group and the oxypropylene group in the polymeric polyether side chain in compound (B) is within a range of from 1:50 to 50:1. More preferably within a range of from 1:20 to 20:1 Most preferably within a range of from 1:6 to 18:1 Particular preferably within a range of from 1:2 to 15:1

For example compounds (B) according to the invention may be most preferred with X being $CH_2CH_2N$, $CH_2CH_2CH_2N$, CH, $CH_2CH$, $CH_2CH_2CH$, C=O or $CH_2CH_2O$, $R^1$ being H, CH, $CH_2$, $CH_3$, $CH_2CH_3$, $C_8$-$C_{16}$-alkyl, $C_8$-$C_{16}$-alkenyl with at least one carbon carbon double bond, $C_8$-$C_{16}$-alkyl-acyl, $C_8$-$C_{16}$-alkenyl-acyl, $CH_2CH_2OH$, $CH_2COO^-$, $CH_2CH_2O$ or $CH_2CH(CH_3)O$, $R^2$ being H, OH, $CH_3$, $CH_2CH_3$, $C_5$-$C_{18}$-alkyl, $C_8$-$C_{16}$-alkenyl with at least one carbon carbon double bond, $CH_2CH_2OH$, $CH_2CH_2O$ or $CH_2CH(CH_3)O$, $R^3$ being H, CH, $CH_2$, $CH_3$, $CH_2CH_3$, $C_8$-$C_{16}$-alkyl, $C_8$-$C_{16}$-alkenyl with at least one carbon carbon double bond, $CH_2CH_2OH$, $CH_2CH_2O$ or $CH_2CH(CH_3)$O, $R^4$ being H, OH, $C_8$-$C_{16}$-alkyl, $C_8$-$C_{16}$-alkenyl with at least one carbon carbon double bond, $C_8$-$C_{16}$-alkyl-acyl, $C_8$-$C_{16}$-alkenyl-acyl, $CH_2CH_2OH$, $CH_2COO^-$, $CH_2COONa$, $CH_2CH_2O$ or $CH_2CH(CH_3)O$, $R^5$ being H, $COO^-$, COONa, $CH_2$, $CH_3$, $C_8$-$C_{16}$-alkyl, $C_8$-$C_{16}$-alkenyl with at least one carbon carbon double bond, $CH_2CH_2OH$, $CH_2COO^-$, $CH_2COONa$, $CH_2CH_2O$ or $CH_2CH(CH_3)O$, $R^6$ being H, OH, $CH_3$, $CH_2CH_3$, $C_8$-$C_{16}$-alkyl, $C_8$-$C_{16}$-alkenyl with at least one carbon carbon double bond, $C_8$-$C_{16}$-alkyl-acyl, $C_8$-$C_{16}$-alkenyl-acyl, $CH_2CH_2OH$, $CH_2CH_2O$ or $CH_2CH(CH_3)O$, $R^7$ being H, OH, CH, $CH_2$, $C_1$-$C_{20}$-alkyl, $C_2$-$C_2$-alkenyl with at least one carbon carbon double bond, $C_1$-$C_{20}$-alkyl-acyl, $C_2$-$C_{20}$-alkenyl-acyl, $CH_2CH_2O$ or $CH_2CH(CH_3)O$, $R^8$ being H, OH, $C_1$-$C_{20}$-alkyl, $C_2$-$C_{20}$-alkenyl with at least one carbon carbon double bond, $CH_2CH_2O$ or $CH_2CH(CH_3)O$, $R^9$ being $O^-$, $CH_3$, $CH_2CH_3$ or $CH_2COO^-$, and u and t are 0 or 1, l, m, o, q, and s are an integer within a range of from 0 to 5 and n, p and r are an integer within a range of from 1 to 5 for a compound according to formula (I) having no polymeric polyether chain in the structure and l, m, o, q and s are an integer within a range of from 0 to 500 and n, p and r are an integer within a range of from 1 to 500 for a compound according to formula (I) having at least one polymeric polyether chain in the structure and when u is at least one and X is C=O or $CH_2CH_2O$, l or r are zero or l and r are zero and when X is $CH_2N$, $CH_2CH_2N$, $CH_2CH_2CH_2N$, $CH_2CH_2CH_2CH_2N$, CH, $CH_2$, $CH_2CH$ or $CH_2CH_2CH$, l or r are at least one or l and r are at least one.

For example compounds (B) according to the invention may be in particular preferred with X being $CH_2CH_2N$, $CH_2CH_2CH_2N$, CH, $CH_2CH$, C=O or $CH_2CH_2O$, $R^1$ being H, $CH_2$, $C_8$-$C_{16}$-alkyl, $C_8$-$C_{16}$-alkenyl with at least one carbon carbon double bond, $CH_2CH_2O$ or $CH_2CH(CH_3)O$, $R^2$ being H, OH, $CH_2CH_2OH$, $CH_2CH_2O$ or $CH_2CH(CH_3)$O, $R^3$ being H, $CH_2$, $CH_3$, $CH_2CH_2O$ or $CH_2CH(CH_3)O$, $R^4$ being H, OH, $C_8$-$C_{16}$-alkyl, $C_8$-$C_{16}$-alkenyl with at least one carbon carbon double bond, $C_8$-$C_{18}$-alkyl-acyl, $C_8$-$C_{18}$-alkenyl-acyl, $CH_2COONa$, $CH_2CH_2O$ or $CH_2CH(CH_3)O$, $R^5$ being H, $CH_2$, $CH_3$, $CH_2COO^-$, $CH_2COONa$, $CH_2CH_2O$ or $CH_2CH(CH_3)O$, $R^6$ being H, OH, $C_8$-$C_{16}$-alkyl, $C_8$-$C_{16}$-alkenyl with at least one carbon carbon double bond, $C_8$-$C_{16}$-alkyl-acyl, $C_8$-$C_{16}$-alkenyl-acyl, $CH_2CH_2OH$, $CH_2CH_2O$ or $CH_2CH(CH_3)O$, $R^7$ being H, OH, $C_8$-$C_{16}$-alkyl, $C_8$-$C_{16}$-alkenyl with at least one carbon carbon double bond, $C_8$-$C_{16}$-alkyl-acyl, $C_8$-$C_{16}$-alkenyl-acyl, $CH_2CH_2O$ or $CH_2CH(CH_3)O$, $R^8$ being H, $C_4$-$C_{18}$-alkyl, $C_4$-$C_{18}$-alkenyl with at least one carbon carbon double bond, $CH_2CH_2O$ or $CH_2CH(CH_3)O$, $R^9$ being $O^-$, $CH_3$ or $CH_2CH_3$ and u and t are 0 or 1, l, m, o, q, and s are an integer within a range of from 0 to 3 and n, p and r are an integer within a range of from 1 to 3 for a compound according to formula (I) having no polymeric polyether chain in the structure and l, m, o, q and s are an integer within a range of from 0 to 250 and n, p and r are an integer within a range of from 1 to 250 for a compound according to formula (I) having at least one polymeric polyether chain in the structure and when u is at least one and X is C=O or $CH_2CH_2O$, l or r are zero or l and r are zero and when X is $CH_2N$, $CH_2CH_2N$, $CH_2CH_2CH_2N$, $CH_2CH_2CH_2CH_2N$, CH, $CH_2$, $CH_2CH$ or $CH_2CH_2CH$, l or r are at least one or l and r are at least one.

For example compounds (B) according to the invention are compounds of the general formula (I) with the following meaning of the indices and variables:

B1:

| | | | |
|---|---|---|---|
| $R^1$ | $CH_2CH_2O$ or $CH_2CH(CH_3)O$ | l | 1 to 100 |
| $R^2$ | $CH_2CH_2O$ or $CH_2CH(CH_3)O$ | m | 1 to 100 |
| $R^3$ | $CH_2CH_2O$ or $CH_2CH(CH_3)O$ | n | 1 to 100 |
| $R^4$ | $CH_2CH_2O$ or $CH_2CH(CH_3)O$ | o | 1 to 100 |
| $R^5$ | $CH_2CH_2O$ or $CH_2CH(CH_3)O$ | p | 1 to 100 |
| $R^6$ | $CH_2CH_2O$ or $CH_2CH(CH_3)O$ | q | 1 to 100 |
| $R^7$ | $CH_2CH_2O$ or $CH_2CH(CH_3)O$ | r | 1 to 100 |
| $R^8$ | $CH_2CH_2O$ or $CH_2CH(CH_3)O$ | s | 1 to 100 |
| $R^9$ | — | t | 0 |
| X | $NCH_2CH_2$ | u | 1 |

The terminal oxyalkylene groups in B1 of the polyether side chains are hydroxy functions

B2:

| | | | |
|---|---|---|---|
| $R^1$ | $CH_2CH(CH_3)O$ | l | 1 |
| $R^2$ | H | m | 1 |
| $R^3$ | $CH_2CH(CH_3)O$ | n | 1 |
| $R^4$ | H | o | 1 |
| $R^5$ | $CH_2CH(CH_3)O$ | p | 1 |
| $R^6$ | H | q | 1 |
| $R^7$ | $CH_2CH(CH_3)O$ | r | 1 |
| $R^8$ | H | s | 1 |
| $R^9$ | — | t | 0 |
| X | $NCH_2CH_2$ | u | 1 |

B3:

| | | | |
|---|---|---|---|
| $R^1$ | — | l | 0 |
| $R^2$ | — | m | 0 |
| $R^3$ | $CH_2CH_2O$ or $CH_2CH(CH_3)O$ | n | 1 to 100 |
| $R^4$ | $CH_2CH_2O$ or $CH_2CH(CH_3)O$ | o | 1 to 100 |
| $R^5$ | $CH_2CH_2O$ or $CH_2CH(CH_3)O$ | p | 1 to 100 |
| $R^6$ | $CH_2CH_2O$ or $CH_2CH(CH_3)O$ | q | 1 to 100 |
| $R^7$ | $CH_2CH_2O$ or $CH_2CH(CH_3)O$ | r | 1 to 100 |
| $R^8$ | $CH_2CH_2O$ or $CH_2CH(CH_3)O$ | s | 1 to 100 |
| $R^9$ | — | t | 0 |
| X | $CH_2CH_2O$ | u | 1 |

B4:

| | | | |
|---|---|---|---|
| $R^1$ | — | l | 0 |
| $R^2$ | — | m | 0 |
| $R^3$ | H | n | 1 |
| $R^4$ | — | o | 0 |
| $R^5$ | $CH_2CH_2O$ or $CH_2CH(CH_3)O$ | p | 1 to 20 |
| $R^6$ | H or $CH_3$ | q | 1 |
| $R^7$ | $C_1$-$C_{20}$-alkyl or $C_2$-$C_{20}$-alkenyl | r | 1 |
| $R^8$ | — | s | 0 |
| $R^9$ | — | t | 0 |
| X | C=O | u | 1 |

B5:

| | | | |
|---|---|---|---|
| $R^1$ | — | l | 0 |
| $R^2$ | — | m | 0 |
| $R^3$ | $CH_3$ | n | 1 |
| $R^4$ | — | o | 0 |
| $R^5$ | $CH_3$ | p | 1 |
| $R^6$ | — | q | 0 |
| $R^7$ | $C_8$-$C_{16}$-alkyl or $C_8$-$C_{16}$-alkenyl | r | 1 |
| $R^8$ | — | s | 0 |
| $R^9$ | O— | t | 1 |
| X | $CH_2$ | u | 1 |

B6:

| | | | |
|---|---|---|---|
| $R^1$ | H | l | 1 |
| $R^2$ | — | m | 0 |
| $R^3$ | $CH_3$ | n | 1 |
| $R^4$ | — | o | 0 |
| $R^5$ | $CH_3$ | p | 1 |
| $R^6$ | — | q | 0 |
| $R^7$ | $C_8$-$C_{16}$-alkyl or $C_8$-$C_{16}$-acyl | r | 1 |
| $R^8$ | — | s | 0 |
| $R^9$ | O— | t | 1 |
| X | $CH_2CH_2CH_2N$ | u | 1 |

B7:

| | | | |
|---|---|---|---|
| $R^1$ | H | l | 1 |
| $R^2$ | — | m | 0 |
| $R^3$ | $CH_2CH_2O$ | n | 1 |
| $R^4$ | H | o | 1 |
| $R^5$ | $CH_2COONa$ | p | 1 |
| $R^6$ | — | q | 0 |
| $R^7$ | $C_8$-$C_{16}$-alkyl or $C_8$-$C_{16}$-acyl | r | 1 |
| $R^8$ | — | s | 0 |
| $R^9$ | — | t | 0 |
| X | $CH_2CH_2N$ | u | 1 |

B8:

| | | | |
|---|---|---|---|
| $R^1$ | H | l | 1 |
| $R^2$ | — | m | 0 |
| $R^3$ | $CH_2CH_2O$ | n | 1 |
| $R^4$ | $CH_2COONa$ | o | 1 |
| $R^5$ | $CH_2COONa$ | p | 1 |
| $R^6$ | — | q | 0 |
| $R^7$ | $C_8$-$C_{16}$-alkyl or $C_8$-$C_{16}$-acyl | r | 1 |
| $R^8$ | — | s | 0 |
| $R^9$ | — | t | 0 |
| X | $CH_2CH_2N$ | u | 1 |

B9:

| | | | |
|---|---|---|---|
| $R^1$ | H | l | 1 |
| $R^2$ | — | m | 0 |
| $R^3$ | $CH_3$ | n | 1 |
| $R^4$ | — | o | 0 |
| $R^5$ | $CH_2COO-$ | p | 1 |
| $R^6$ | — | q | 0 |
| $R^7$ | $C_8$-$C_{16}$-alkyl or $C_8$-$C_{16}$-acyl | r | 1 |
| $R^8$ | — | s | 0 |
| $R^9$ | $CH_3$ | t | 1 |
| X | $CH_2CH_2CH_2N$ | u | 1 |

B10:

| | | | |
|---|---|---|---|
| $R^1$ | $C_8$-$C_{16}$-alkyl | l | 1 |
| $R^2$ | — | m | 0 |
| $R^3$ | $CH_2$ | n | 2 |
| $R^4$ | OH | o | 1 |
| $R^5$ | $CH_3$ | p | 1 |
| $R^6$ | — | q | 0 |
| $R^7$ | OH | r | 1 |
| $R^8$ | — | s | 0 |
| $R^9$ | $CH_3$ | t | 1 |
| X | $CH_2CH$ | u | 1 |

B11:

| | | | |
|---|---|---|---|
| $R^1$ | $C_8$-$C_{16}$-alkyl | l | 1 |
| $R^2$ | — | m | 0 |
| $R^3$ | $CH_2$ | n | 2 |
| $R^4$ | OH | o | 1 |
| $R^5$ | $CH_2$ | p | 2 |
| $R^6$ | OH | q | 1 |
| $R^7$ | — | r | 0 |
| $R^8$ | — | s | 0 |
| $R^9$ | — | t | 0 |
| X | C=O | u | 1 |

B12:

| | | | |
|---|---|---|---|
| $R^1$ | $C_8$-$C_{16}$-alkyl | l | 1 |
| $R^2$ | — | m | 0 |
| $R^3$ | $CH_2$ | n | 2 |
| $R^4$ | OH | o | 1 |
| $R^5$ | $CH_2$ | p | 2 |
| $R^6$ | OH | q | 1 |
| $R^7$ | OH | r | 1 |
| $R^8$ | — | s | 0 |
| $R^9$ | — | t | 0 |
| X | $CH_2CH$ | u | 1 |

B13:

| | | | |
|---|---|---|---|
| $R^1$ | $CH_2$ | l | 1 |
| $R^2$ | OH | m | 1 |
| $R^3$ | H | n | 1 |
| $R^4$ | — | o | 0 |
| $R^5$ | H | p | 1 |
| $R^6$ | — | q | 0 |
| $R^7$ | OHCHCHOH | r | 1 |
| $R^8$ | $C_8$-$C_{16}$-alkyl | s | 1 |
| $R^9$ | — | t | 0 |
| X | CH | u | 1 |

B14:

| | | | |
|---|---|---|---|
| $R^1$ | — | l | 0 |
| $R^2$ | — | m | 0 |
| $R^3$ | $CH_2CH_2O$ | n | 1 |
| $R^4$ | $C_8$-$C_{16}$-alkyl-acyl or $C_8$-$C_{16}$-alkenyl-acyl | o | 1 |
| $R^5$ | $CH_2CH_2O$ | p | 1 |
| $R^6$ | $C_8$-$C_{16}$-alkyl-acyl or $C_8$-$C_{16}$-alkenyl-acyl | q | 1 |
| $R^7$ | — | r | 0 |
| $R^8$ | — | s | 0 |
| $R^9$ | — | t | 0 |
| X | $CH_2CH_2OH$ | u | 1 |

B15:

| | | | |
|---|---|---|---|
| $R^1$ | — | l | 0 |
| $R^2$ | — | m | 0 |
| $R^3$ | $CH_2CH_2O$ | n | 1 |
| $R^4$ | $C_8$-$C_{16}$-alkyl-acyl or $C_8$-$C_{16}$-alkenyl-acyl | o | 1 |
| $R^5$ | $CH_2CH_2O$ | p | 1 |
| $R^6$ | $C_8$-$C_{16}$-alkyl-acyl or $C_8$-$C_{16}$-alkenyl-acyl | q | 1 |
| $R^7$ | — | r | 0 |
| $R^8$ | — | s | 0 |
| $R^9$ | $CH_3$ | t | 1 |
| X | $CH_2CH_2OH$ | u | 1 |

The anion in B15 is $CH_3OSO_2^-$

According to the invention the amount of (B) in the CMP composition (Q) is not more than 0.5 wt. %, more preferably not more than 0.3 wt. %, most preferably not more than 0.2 wt. %, particularly not more than 0.15 wt. %, based on the total weight of the composition (Q). According to the invention, the amount of (B) is at least 0.001 wt. %, preferably at least 0.002 wt. %, more preferably at least 0.005 wt. %, most preferably at least 0.007 wt. %, particularly at least 0.008 wt. %, based on the total weight of the composition (Q). For example the amount of (B) can be in the range of from 0.01 wt. % to 0.12 wt. %.

According to the invention the CMP composition comprises an aqueous medium (C). (C) can be of one type or a mixture of different types of aqueous media.

In general, the aqueous medium (C) can be any medium which contains water. Preferably, the aqueous medium (C) is a mixture of water and an organic solvent miscible with water (e.g. an alcohol, preferably a $C_1$ to $C_3$ alcohol, or an alkylene glycol derivative). More preferably, the aqueous medium (C) is water. Most preferably, the aqueous medium (C) is de-ionized water.

If the amounts of the components other than (C) are in total x % by weight of the CMP composition, then the amount of (C) is (100−x) % by weight of the CMP composition.

The chemical-mechanical polishing (CMP) composition (Q) of the present invention further optionally comprises one or more oxidizing agents (D), preferably one or two types of oxidizing agent, more preferably one type of oxidizing agent. In general, an oxidizing agent (D) is a compound which is capable of oxidizing the to-be-polished substrate or one of its layers.

Preferably, one or at least one of the more than one oxidizing agents (D) is a per-type oxidizer. More preferably, the one or at least one of the more than one oxidizing agent (D) is selected from the group consisting of peroxides, persulfates, perchlorates, perbromates, periodates and permanganates and derivates thereof. Most preferably, such oxidizing agent (D) is a peroxide or persulfate. Particularly, such oxidizing agent (D) is a peroxide. In particular, (D) is hydrogen peroxide.

If present, the total amount of oxidizing agent(s) (D), can be contained in any of a broad range of proportions in the CMP composition of the present invention. Preferably, the total amount of (D) is not more than 20 wt. %, more preferably not more than 10 wt. %, most preferably not more than 5 wt. %, particularly not more than 2.5 wt. %, for example not more than 1.5 wt. %, in each case based on the total weight of the composition. Preferably, the total amount of (D) is at least 0.01 wt. %, more preferably at least 0.08 wt. %, most preferably at least 0.4 wt. %, particularly at least 0.75 wt. %, for example at least 1 wt. %, in each case based on the total weight of the respective CMP composition of the present invention. If hydrogen peroxide is used as the sole oxidizing agent (D), the total amount of (D) is preferably 0.5 wt. % to 4 wt. %, more preferably 1 wt. % to 2 wt. %, for instance 1.2 to 1.3 wt. %, in each case based on the total weight of the respective CMP composition of the present invention.

The chemical-mechanical polishing (CMP) composition (Q) in addition to (A), (B), (C) and (D) can comprise one or more additional constituents as defined hereinbelow.

The properties of the CMP composition according to the invention respectively, such as stability, polishing performance and etching behavior of the composition as against different materials, for example metals vs. silicon dioxide, may depend on the pH of the corresponding composition.

According to the invention the CMP composition (Q) has a pH in the range of from 2 to 6. Preferably, the pH value of the compositions used or according to the invention respectively is in the range of from 2.5 to 5.8, more preferably from 3.2 to 5.5, most preferably from 3.5 to 5.3, particularly preferably from 3.7 to 5.2, for example from 3.8 to 5.1.

The CMP composition (Q) can further optionally contain at least one pH adjusting agent (N) in an amount of from 0 to 2 wt. % based on the total weight of the CMP composition (Q). The pH adjusting agent (N) is different from the components (A), (B) and (C). In general, the pH adjusting agent (N) is a compound which is added to the CMP composition (Q) to have its pH value adjusted to the required value. Preferably, the CMP composition (Q) contains at least one pH adjusting agent (N). Preferred pH adjusting agents are inorganic acids, carboxylic acids, amine bases, alkali hydroxides, ammonium hydroxides, including tetraalkylammonium hydroxides. Particularly, the pH adjusting agent (N) is nitric acid, sulfuric acid, ammonia, sodium hydroxide, or potassium hydroxide. For example, the pH adjusting agent (N) is potassium hydroxide or nitric acid.

If present, the pH adjusting agent (N) can be contained in various amounts. If present, the amount of (N) is preferably not more than 2 wt. %, more preferably not more than 1 wt. %, most preferably not more than 0.5 wt. %, particularly not more than 0.1 wt. %, for example not more than 0.05 wt. %, based on the total weight of the CMP composition (Q). If present, the amount of (N) is preferably at least 0.0005 wt. %, more preferably at least 0.005 wt. %, most preferably at least 0.025 wt. %, particularly at least 0.1 wt. %, for example at least 0.4 wt. %, based on the total weight of the corresponding composition (Q).

The CMP composition of the invention can further optionally contain at least one complexing agent (E), for example one complexing agent. In general, the complexing agent is a compound which is capable of complexing the ions of the to-be-polished substrate or of one of its layers. Preferably, (E) is a carboxylic acid having at least two COOH groups, an N-containing carboxylic acid, N-containing sulfonic acid, N-containing sulfuric acid, N-containing phosphonic acid, N-containing phosphoric acid, or a salt thereof. More preferably, (E) is a carboxylic acid having at least two COOH groups, an N-containing carboxylic acid, or a salt thereof. Most preferably, (E) is an amino acid, or a salt thereof. For example, (E) is glycine, serine, alanine, hystidine, or a salt thereof.

If present, the complexing agent (E) can be contained in varying amounts. Preferably, the amount of (E) is not more than 20 wt. %, more preferably not more than 10 wt. %, most preferably not more than 5 wt. %, for example not more than 2 wt. %, based on the total weight of the corresponding composition. Preferably, the amount of (E) is at least 0.05 wt. %, more preferably at least 0.1 wt. %, most preferably at least 0.5 wt. %, for example at least 1 wt. %, based on the total weight of the corresponding composition.

The CMP composition of the invention can further optionally contain at least one biocide (H), for example one biocide. In general, the biocide is a compound which deters, renders harmless, or exerts a controlling effect on any harmful organism by chemical or biological means. Preferably, (H) is an quaternary ammonium compound, an isothiazolinone-based compound, an N-substituted diazenium dioxide, or an N-hydroxy-diazenium oxide salt. More preferably, (H) is an N-substituted diazenium dioxide, or an N-hydroxy-diazenium oxide salt.

If present, the biocide (H) can be contained in varying amounts. If present, the amount of (H) is preferably not more than 0.5 wt. %, more preferably not more than 0.1 wt. %, most preferably not more than 0.05 wt. %, particularly not more than 0.02 wt. %, for example not more than 0.008 wt. %, based on the total weight of the corresponding composition. If present, the amount of (H) is preferably at least 0.0001 wt. %, more preferably at least 0.0005 wt. %, most preferably at least 0.001 wt. %, particularly at least 0.003 wt. %, for example at least 0.006 wt. %, based on the total weight of the corresponding composition.

The CMP compositions according to the invention respectively may also contain, if necessary, various other additives, including but not limited to stabilizers, surfactants etc. Said other additives are for instance those commonly employed in CMP compositions and thus known to the person skilled in the art. Such addition can for example stabilize the dispersion, or improve the polishing performance, or the selectivity between different layers.

If present, said additive can be contained in varying amounts. Preferably, the amount of said additive is not more than 10 wt. %, more preferably not more than 1 wt. %, most preferably not more than 0.1 wt. %, for example not more than 0.01 wt. %, based on the total weight of the corresponding composition. Preferably, the amount of said additive is at least 0.0001 wt. %, more preferably at least 0.001 wt. %, most preferably at least 0.01 wt. %, for example at least 0.1 wt. %, based on the total weight of the corresponding composition.

Examples of CMP compositions (Q) according to the invention:

Z1:
- (A) inorganic particles in amount of from 0.1 to 2.2 wt.-% based on the total weight of the respective CMP composition
- (B1) wherein l, m, n, o, p, q, r and s are independently from each other an integer of from 1 to 150
- (C) an aqueous medium wherein the composition (Q) has a pH of from 2.8 to 5.2.

Z2:
- (A) silica particles in amount of from 0.1 to 2.9 wt.-% based on the total weight of the respective CMP composition (B1) wherein l, m, n, o, p, q, r and s are independently from each other an integer of from 1 to 120
(C) an aqueous medium
wherein the composition (Q) has a pH of from 2.2 to 5.4.

Z3:
(A) silica particles in amount of from 0.5 to 2.3 wt.-% based on the total weight of the respective CMP composition
(B1) wherein l, n, p and r are independently from each other an integer of from 1 to 48 and m, o, q and s are independently from each other an integer of from 8 to 87
(C) an aqueous medium
wherein the composition (Q) has a pH of from 2.2 to 5.4.

Z4:
(A) silica particles in amount of from 0.2 to 3.4 wt.-% based on the total weight of the respective CMP composition
(B1) wherein l, n, p and r are independently from each other an integer of from 1 to 25 and m, o, q and s are independently from each other an integer of from 5 to 95, $R^1$, $R^3$, $R^5$ and $R^7$ are $CH_2CH_2O$ and $R^2$, $R^4$, $R^6$ and $R^8$ are $CH_2CH(CH_3)O$.
(C) an aqueous medium
wherein the composition (Q) has a pH of from 2.2 to 5.4.

Z5:
(A) silica particles in amount of from 0.2 to 1.8 wt.-% based on the total weight of the respective CMP composition
(B1) wherein l, n, p and r are independently from each other an integer of from 1 to 60 and m, o, q and s are independently from each other an integer of from 10 to 110, $R^1$, $R^3$, $R^5$ and $R^7$ are $CH_2CH_2O$ and $R^2$, $R^4$, $R^6$ and $R^8$ are $CH_2CH(CH_3)O$.
(C) an aqueous medium
wherein the composition (Q) has a pH of from 2.2 to 4.8.

Z6:
(A) silica particles in amount of from 0.5 to 2.3 wt.-% based on the total weight of the respective CMP composition
(B1) wherein l, n, p and r are independently from each other an integer of from 1 to 75 and m, o, q and s are independently from each other an integer of from 4 to 90 in an amount of from 0.001 to 0.3 wt-% based on the total weight of the respective CMP composition
(C) an aqueous medium
wherein the composition (Q) has a pH of from 2.6 to 4.6.

Z7:
(A) silica particles in amount of from 0.2 to 3.4 wt.-% based on the total weight of the respective CMP composition
(B1) wherein l, n, p and r are independently from each other an integer of from 1 to 85 and m, o, q and s are independently from each other an integer of from 5 to 150, $R^1$, $R^3$, $R^5$ and $R^7$ are $CH_2CH(CH_3)O$ and $R^2$, $R^4$, $R^6$ and $R^8$ are $CH_2CH_2O$.
(C) an aqueous medium
wherein the composition (Q) has a pH of from 2.2 to 5.4.

Z8:
(A) silica particles in amount of from 0.2 to 3.4 wt.-% based on the total weight of the respective CMP composition
(B2) in an amount of from 0.001 to 0.3 wt.-% based on the total weight of the respective CMP composition
(C) an aqueous medium
wherein the composition (Q) has a pH of from 2.2 to 5.4.

Z9:
(A) silica particles in amount of from 0.2 to 3.4 wt.-% based on the total weight of the respective CMP composition
(B5) in an amount of from 0.001 to 0.3 wt.-% based on the total weight of the respective CMP composition
(C) an aqueous medium
wherein the composition (Q) has a pH of from 2.2 to 5.4.

Z10:
(A) silica particles in amount of from 0.2 to 3.4 wt.-% based on the total weight of the respective CMP composition
(B6) in an amount of from 0.001 to 0.3 wt.-% based on the total weight of the respective CMP composition
(C) an aqueous medium
wherein the composition (Q) has a pH of from 2.2 to 5.4.

Z11:
(A) silica particles in amount of from 0.2 to 3.4 wt.-% based on the total weight of the respective CMP composition
(B8) in an amount of from 0.001 to 0.3 wt.-% based on the total weight of the respective CMP composition
(C) an aqueous medium
wherein the composition (Q) has a pH of from 2.2 to 5.4.

Z12:
A) silica particles in amount of from 0.2 to 3.4 wt.-% based on the total weight of the respective CMP composition
(B9) in an amount of from 0.001 to 0.3 wt.-% based on the total weight of the respective CMP composition
(C) an aqueous medium
wherein the composition (Q) has a pH of from 2.2 to 5.4.

Z13:
A) silica particles in amount of from 0.2 to 3.4 wt.-% based on the total weight of the respective CMP composition
(B10) in an amount of from 0.001 to 0.3 wt.-% based on the total weight of the respective CMP composition
(C) an aqueous medium
wherein the composition (Q) has a pH of from 2.2 to 5.4.

Z14:
A) silica particles in amount of from 0.2 to 3.4 wt.-% based on the total weight of the respective CMP composition
(B11) in an amount of from 0.001 to 0.3 wt.-% based on the total weight of the respective CMP composition
(C) an aqueous medium
wherein the composition (Q) has a pH of from 2.2 to 5.4.

Z15:
A) silica particles in amount of from 0.2 to 2.4 wt.-% based on the total weight of the respective CMP composition
(B12) in an amount of from 0.001 to 0.3 wt.-% based on the total weight of the respective CMP composition
(C) an aqueous medium
wherein the composition (Q) has a pH of from 2.2 to 5.4.

Z16:
A) silica particles in amount of from 0.2 to 2.6 wt.-% based on the total weight of the respective CMP composition
(B13) in an amount of from 0.001 to 0.3 wt.-% based on the total weight of the respective CMP composition
(C) an aqueous medium
wherein the composition (Q) has a pH of from 2.2 to 5.4.

Z17:
A) silica particles in amount of from 0.2 to 3.1 wt.-% based on the total weight of the respective CMP composition (B14) in an amount of from 0.001 to 0.3 wt.-% based on the total weight of the respective CMP composition
(C) an aqueous medium
wherein the composition (Q) has a pH of from 2.2 to 5.4.
Z18:
A) silica particles in amount of from 0.2 to 2.9 wt.-% based on the total weight of the respective CMP composition
(B15) in an amount of from 0.001 to 0.3 wt.-% based on the total weight of the respective CMP composition
(C) an aqueous medium
wherein the composition (Q) has a pH of from 2.2 to 5.4.

A semiconductor device can be manufactured by the process of the invention, said process comprises the chemical mechanical polishing of elemental germanium and/or $Si_{1-x}Ge_x$ material (with $0.1 \leq x<1$) in the presence of the CMP composition (Q), preferably, said process comprises the chemical mechanical polishing of elemental germanium and/or $Si_{1-x}Ge_x$ in the presence of the CMP composition (Q).

Generally, the semiconductor device which can be manufactured by the process according to the invention is not particularly limited. Thus the semiconductor devices can be an electronic component comprising semiconducting materials, as for example silicon, germanium, and III-V materials. Semiconductor devices can be those which are manufactured as single discrete devices or those which are manufactured as integrated circuits (ICs) consisting of a number of devices manufactured and interconnected on a wafer. Semiconductor devices can be two terminal devices for example a diode, three terminal devices for example a bipolar transistor, four terminal devices for example a Hall effect sensor or multi-terminal devices. Preferably, said semiconductor device is a multi-terminal device. Multi-terminal devices can be logic devices as integrated circuits and microprocessors or memory devices as random access memory (RAM), read only memory (ROM) and phase change random access memory (PCRAM). Preferably said semiconductor device is a multi-terminal logic device. In particular said semiconductor device is an integrated circuit or microprocessor.

Generally, this elemental germanium and/or $Si_{1-x}Ge_x$ can be of any type, form, or shape of elemental germanium and/or $Si_{1-x}Ge_x$. This elemental germanium and/or $Si_{1-x}Ge_x$ preferably has the shape of a layer and/or overgrowth. If this elemental germanium and/or $Si_{1-x}Ge_x$ has the shape of a layer and/or overgrowth, the germanium and/or $Si_{1-x}Ge_x$ content is preferably more than 90%, more preferably more than 95%, most preferably more than 98%, particularly more than 99%, for example more than 99.9% by weight of the corresponding layer and/or overgrowth. Generally, this elemental germanium and/or $Si_{1-x}Ge_x$ can be produced or obtained in different ways. This elemental germanium and/or $Si_{1-x}Ge_x$ has been preferably filled or grown in trenches between other substrates, more preferably filled or grown in trenches between silicon dioxide, silicon, or other isolating and semiconducting material used in the semiconductor industry, most preferably filled or grown in trenches between the STI (shallow-trench isolation) silicon dioxide, particularly grown in trenches between the STI silicon dioxide in a selective epitaxial growth process. If this elemental germanium and/or $Si_{1-x}Ge_x$ has been filled or grown in trenches between the STI silicon dioxide, the depth of said trenches is preferably from 20 to 500 nm, more preferably from 150 to 400 nm, and most preferably from 250 to 350 nm, particularly from 280 to 320 nm. In another embodiment, if this elemental germanium and/or $Si_{1-x}Ge_x$ has been filled or grown in trenches between silicon dioxide, silicon, or other isolating and semiconducting material used in the semiconductor industry, the depth of said trenches is preferably from 5 to 100 nm, more preferably from 8 to 50 nm, and most preferably from 10 to 35 nm, particularly from 15 to 25 nm.

Elemental germanium is germanium in form of its chemical element and preferably does not include germanium salts or germanium alloys with a content of less than 90% germanium by weight of the corresponding alloy.

Said $Si_{1-x}Ge_x$ material (with $0.1 \leq x<1$) can be of any type, form, or shape of $Si_{1-x}Ge_x$ material with $0.1 \leq x<1$. Generally, x can be any value in the range of $0.1 \leq x<1$. Preferably, x is in the range of $0.1 \leq x<0.8$, more preferably, x is in the range of $0.1 \leq x<0.5$, most preferably, x is in the range of $0.1 \leq x<0.3$, for example x is 0.2. Said $Si_{1-x}Ge_x$ material is preferably a $Si_{1-x}Ge_x$ layer, more preferably a strain-relaxed $Si_{1-x}Ge_x$ layer. This strain-relaxed $Si_{1-x}Ge_x$ layer can be the one described in paragraph [0006] of US 2008/0265375 A1, which is incorporated by reference herewith.

If the process of the invention comprises the chemical mechanical polishing of a substrate comprising elemental germanium and/or $Si_{1-x}Ge_x$ and silicon dioxide, the selectivity of germanium and/or $Si_{1-x}Ge_x$ to silicon dioxide with regard to the material removal rate is preferably higher than 10:1, more preferably higher than 20:1, most preferably higher than 30:1, particularly higher than 50:1, especially higher than 75:1, for example higher than 100:1. This selectivity can be adjusted for example by the type and concentration of organic compound (B) of the CMP composition (Q) and by setting other parameters such as the pH value and the oxidizer (D) concentration. The effect on the polishing performance by varying the oxidizer concentration (D) can in particular be seen by polishing $Si_{1-x}Ge_x$ material (with $0.1 \leq x<1$).

The CMP composition (Q) according to the invention is used preferably for chemical-mechanical polishing of a substrate comprising elemental germanium and/or $Si_{1-x}Ge_x$ material (with $0.1 \leq x<1$), preferably for chemical-mechanical polishing of a substrate comprising an elemental germanium and/or $Si_{1-x}Ge_x$ layer and/or overgrowth. The germanium and/or $Si_{1-x}Ge_x$ content of said elemental germanium and/or $Si_{1-x}Ge_x$ layer and/or overgrowth is preferably more than 90%, more preferably more than 95%, most preferably more than 98%, particularly more than 99%, for example more than 99.9% by weight of the corresponding layer and/or overgrowth. The elemental germanium and/or $Si_{1-x}Ge_x$ layer and/or overgrowth can be obtained in different ways, preferably by filling or growing in trenches between other substrates, more preferably by filling or growing in trenches between silicon dioxide, silicon, or other isolating and semiconducting material used in the semiconductor industry, most preferably by filling or growing in trenches between the STI (shallow-trench isolation) silicon dioxide, particularly by growing in trenches between the STI silicon dioxide in a selective epitaxial growth process.

If the CMP composition (Q) according to the invention is used for polishing a substrate comprising elemental germanium and silicon dioxide, the selectivity of germanium and/or $Si_{1-x}Ge_x$ to silicon dioxide with regard to the material removal rate is preferably higher than 10:1, more preferably higher than 20:1, most preferably higher than 30:1, particularly higher than 50:1, especially higher than 75:1, for example higher than 100:1.

Processes for preparing CMP compositions are generally known. These processes may be applied to the preparation of the CMP composition (Q) according to the invention. This can be carried out by combining, for example dispersing or dissolving the above-described components (A) and (B) in the aqueous medium (C), preferably water, and optionally by adjusting the pH value through adding an acid, a base, a buffer or an pH adjusting agent. For this purpose, customary and standard mixing processes and mixing apparatuses such as agitated vessels, high shear impellers, ultrasonic mixers, homogenizer nozzles or counterflow mixers, can be used.

The CMP composition (Q) is preferably prepared by dispersing the inorganic particles (A) and dissolving the compound (B) in the aqueous medium (C) and adjusting the pH value to 2 to 6.

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention, the CMP composition (Q) is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

Figure 2:
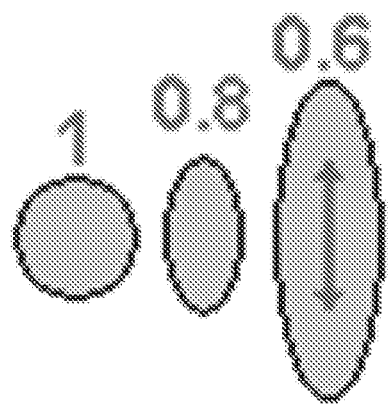

For further details explicit reference is made to WO 2004/063301 A1, in particular page 16, paragraph [0036] to page 18, paragraph [0040] in conjunction with the FIG. 2.

By way of the CMP process of the invention, wafers with integrated circuits comprising a dielectric layer can be obtained which have an excellent functionality.

The CMP composition (Q) according to the invention can be used in the CMP process as ready-to-use slurry, they have a long shelf-life and show a stable particle size distribution over long time. Thus, they are easy to handle and to store. They show an excellent polishing performance, particularly with regard to the combination of high germanium and/or $Si_{1-x}Ge_x$ MRR and high Ge and/or $Si_{1-x}Ge_x$:$SiO_2$ selectivity and/or the combination of high germanium and/or $Si_{1-x}Ge_x$ MRR and low germanium and/or $Si_{1-x}Ge_x$ SER.

In particular the CMP composition (Q) according to the invention can be used for the polishing of substrates comprising elemental germanium grown in trenches between the STI (shallow-trench isolation) silicon dioxide or elemental germanium or $Si_{1-x}Ge_x$ which has the shape of a layer and/or overgrowth and has a germanium and/or $Si_{1-x}Ge_x$ content of more than 98% by weight of the corresponding layer and/or overgrowth.

Since the amounts of its components are held down to a minimum, the CMP composition (Q) and the CMP process according to the invention can be used or applied in a cost-effective way. The fact that the CMP composition (Q) is additive-free also leads to a simplified way of making the CMP compositions according to the invention.

Without wishing to be bound by a particular theory, it is important for a strong inhibiting effect to have molecules which have amine functions and hydroxyl functions in a balanced ratio to enable a good interaction of the inhibitor with the germanium surface and simultaneously are leading to a more hydrophobic surface of the to be polished substrate.

The figures show:

FIG. 1: Schematic illustration of the variation of the shape factor with the shape of a particle FIG. 2: Schematic illustration of the variation of the sphericity with the elongation of a particle FIG. 3: Schematic illustration of the Equivalent Circle Diameter (ECD)

Figure 4:
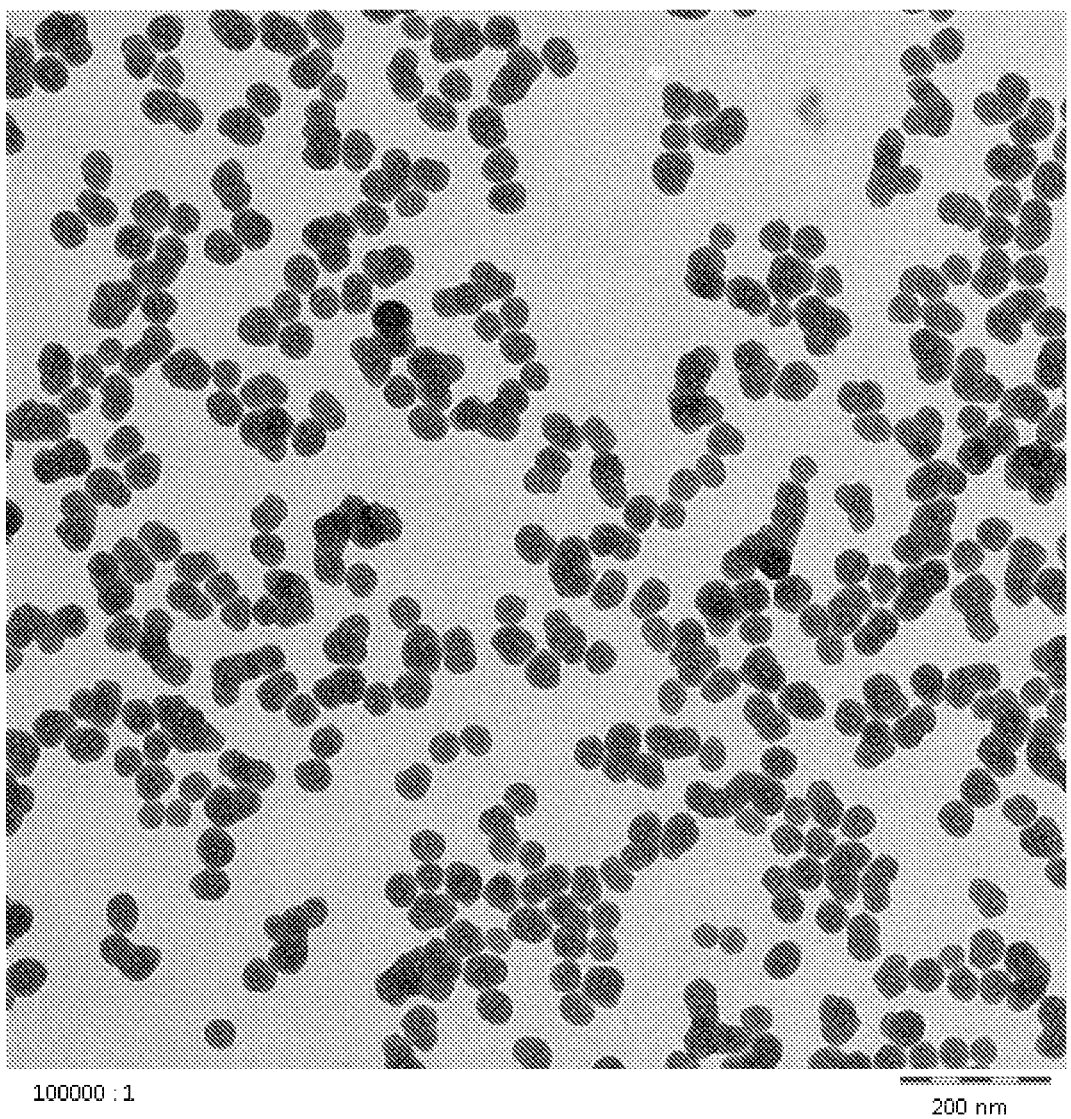

FIG. 4: Energy Filtered-Transmission Electron Microscopy (EF-TEM) (120 kilo volts) image of a dried cocoon-shaped silica particle dispersion with 20 wt. % solid content on a carbon foil

EXAMPLES AND COMPARATIVE EXAMPLES

The pH value is measured with a pH electrode (Schott, blue line, pH 0-14/−5 . . . 100° C./3 mol/L sodium chloride).

Ge-cSER (cold static etching rate of a germanium layer) is determined by dipping 1×1 inch germanium coupon obtained from KAMIC Inc. into the corresponding composition for 10 minutes at 25° C. and measuring the loss of mass before and after the dipping.

Ge-hSER (hot static etching rate of a germanium layer) is determined by dipping 1×1 inch germanium coupon obtained from KAMIC Inc. into the corresponding composition for 10 minutes at 50° C. and measuring the loss of mass before and after the dipping.

Colloidal cocoon-shaped Silica particles (A1) having an average primary particle size (d1) of 35 nm and an average secondary particle size (d2) of 70 nm (as determined using dynamic light scattering techniques) (for example Fuso PL-3) were used.

TABLE 1

Experimental results of particle shape analysis of cocoon-shaped silica particles (A)

| statistical function unit | ECD nm | sphericity | shape factor |
|---|---|---|---|
| number of particles | 475 | 475 | 475 |
| average | 53.67 | 0.631 | 0.881 |
| minimum | 33.68 | 0.150 | 0.513 |
| maximum | 99.78 | 0.997 | 0.978 |

TABLE 1-continued

Experimental results of particle shape analysis of cocoon-shaped silica particles (A)

| statistical function unit | ECD nm | sphericity | shape factor |
|---|---|---|---|
| standard deviation | 11.69 | 0.199 | 0.083 |
| median d50 | 51.32 | 0.662 | 0.911 |
| d90 | | | 0.955 |

Procedure for Particle Shape Characterization

An aqueous cocoon-shaped silica particle dispersion with 20 wt. % solid content was dispersed on a carbon foil and was dried. The dried dispersion was analyzed by using Energy Filtered-Transmission Electron Microscopy (EF-TEM) (120 kilo volts) and Scanning Electron Microscopy secondary electron image (SEM-SE) (5 kilo volts). The EF-TEM image with a resolution of 2 k, 16 Bit, 0.6851 nm/pixel (FIG. 4) was used for the analysis. The images were binary coded using the threshold after noise suppression. Afterwards the particles were manually separated. Overlying and edge particles were discriminated and not used for the analysis. ECD, shape factor and sphericity as defined before were calculated and statistically classified.

A2 are particles with a specific surface area of around 200 g/m² with an average diameter of 15-25 nm as determined by dynamic light scattering (for example Levasil 200E supplied by Akzo Nobel). A3 are Particles with an average diameter of 85-95 nm, as determined by dynamic light scattering (for example Nexsil 125A supplied by Nyacol company).

For measuring electrophoretic mobility a standard Zeta-sizer Nano device from the company Malvern was used. The samples were diluted by a factor of 500 with 10 mmol/KCl solution before measuring the mobility. The measurements were carried out at 23° C.

For the evaluation on benchtop polisher, the following parameters were chosen:

Powerpro 5000 Bühler. DF=35 N, Table speed 150 rpm, Platen speed 150 rpm, slurry flow 20 ml/min, 20 s conditioning, 3 min polishing time, IC1000 pad, diamond conditioner (3M).

The pad is conditioned by several sweeps, before a new type of CMP composition is used for CMP. For the determination of removal rates at least 2 wafers are polished and the data obtained from these experiments are averaged.

The CMP composition is stirred in the local supply station.

The germanium material removal rates (Ge-MRR) for 2 inch discs polished by the CMP composition are determined by difference of weight of the coated wafers or blanket discs before and after CMP, using a Sartorius LA310 S scale. The difference of weight can be converted into the difference of film thickness since the density (5.323 g/cm³ for germanium) and the surface area of the polished material are known. Dividing the difference of film thickness by the polishing time provides the values of the material removal rate.

The silicon oxide material removal rates (oxide MRR) for 2 inch Wafers polished by the CMP composition are determined by difference of weight of the coated wafers before and after CMP, using a Sartorius LA310 S scale. The difference of weight can be converted into the difference of film thickness since the density (2.648 g/cm³ for silicon oxide) and the surface area of the polished material are known. Dividing the difference of film thickness by the polishing time provides the values of the material removal rate.

Objective to be polished: unstructured germanium wafer and/or unstructured silicon oxide wafer on bench top polisher For wafer polishing a reflexion tool was used for 300 mm wafers and a Mirra Mesa tool was used for 200 mm wafers both supplied by AMAT. AS polishing pad, IC1000 pad (Dow chemicals) was used with platen speed of 93 rpm and Head speed of 87 rpm. Polishing pressure was 2 psi and Slurry flow was 150 mL/min for 300 mm tool and 200 mL min for Mirra Mesa polisher.

MRR was determined by weight loss using tool supplied by Metryx or by optical thickness determination of layer thickness of the $Si_{1-x}Ge_x$ layer (e.g. KLA Spectra CD100 or OP2600 tool).

The components (A), (B) and optionally (D)—each in the amounts as indicated in Table 1—were dispersed or dissolved in de-ionized water (C). pH is adjusted by adding of aqueous ammonia solution (0.1%-10%), 10% KOH solution or $HNO_3$ (0.1%-10%) to the slurry. The pH value is measured with a pH combination electrode (Schott, blue line 22 pH).

TABLE 2

CMP compositions of the examples 1 to 24 and of the comparative example V1, their pH values, Ge-cSER, Ge-hSER data as well as their Ge-MRR and oxide-MRR data in the process of chemical-mechanical polishing of 2" unstructured germanium wafers using these compositions, wherein the aqueous medium (C) of the CMP compositions is de-ionized water. The amounts of the components (A), (B), (D) are specified in weight percent (wt. %) by weight of the corresponding CMP composition. If the amounts of the components other than (C) are in total y % by weight of the CMP composition, then the amount of (C) is (100 − y) % by weight of the CMP composition.

| | Comparative Example V1 | Example 1 | Example 2 | Example 3 |
|---|---|---|---|---|
| Particles (A) | A1 1.5 wt. % | A1 1.5 wt. % | A1 1.5 wt. % | A1 2.5 wt. % |
| Oxidizing agent (D) | $H_2O_2$ 0.75 wt. % | $H_2O_2$ 0.75 wt. % | $H_2O_2$ 2.5 wt. % | $H_2O_2$ 0.75 wt. % |
| Organic compound (B) | — | B1 0.1 wt % | B1 0.1 wt % | B1 0.1 wt % |
| pH | 4 | 4 | 4 | 4 |
| Ge-MRR [Å/min] | 859 | 820 | 1109 | 894 |
| Ge-hSER [Å/min] | 840 | 106 | 115 | 107 |
| Oxide-MRR [Å/min] | 177 | 63 | 69 | 152 |
| Ratio Ge-MRR to Oxide-MRR | 4.9 | 13 | 16 | 6 |

TABLE 2-continued

CMP compositions of the examples 1 to 24 and of the comparative example V1, their pH values, Ge-cSER, Ge-hSER data as well as their Ge-MRR and oxide-MRR data in the process of chemical-mechanical polishing of 2" unstructured germanium wafers using these compositions, wherein the aqueous medium (C) of the CMP compositions is de-ionized water. The amounts of the components (A), (B), (D) are specified in weight percent (wt. %) by weight of the corresponding CMP composition. If the amounts of the components other than (C) are in total y % by weight of the CMP composition, then the amount of (C) is (100 − y) % by weight of the CMP composition.

|  | Example 4 | Example 5 | Example 6 | Example 7 |
| --- | --- | --- | --- | --- |
| Particles (A) | A1 1.5 wt. % | A1 1.5 wt. % | A1 2.5 wt. % | A1 1.5 wt. % |
| Oxidizing agent (D) | $H_2O_2$ 0.75 wt. % | $H_2O_2$ 2.5 wt. % | $H_2O_2$ 0.75 wt. % | $H_2O_2$ 0.75 wt. % |
| Organic compound (B) | B4 0.1 wt % | B4 0.1 wt % | B4 0.1 wt % | B7 0.1 wt % |
| pH | 4 | 4 | 4 | 4 |
| Ge-MRR [Å/min] | 481 | 769 | 613 | 761 |
| Ge-hSER [Å/min] | 144 | 164 | 144 | 94 |
| Oxide-MRR [Å/min] | 9 | 49 | 84 | 161 |
| Ratio Ge-MRR to Oxide-MRR | 54 | 16 | 7 | 5 |

|  | Example 8 | Example 9 | Example 10 |
| --- | --- | --- | --- |
| Particles (A) | A1 1.5 wt. % | A2 1.5 wt. % | A3 1.5 wt. % |
| Oxidizing agent (D) | $H_2O_2$ 0.75 wt. % | $H_2O_2$ 0.75 wt. % | $H_2O_2$ 0.75 wt. % |
| Organic compound (B) | B3 | B1 | B7 |
| pH | 4 | 4 | 4 |
| Ge-MRR [Å/min] | 717 | 749 | 456 |
| Ge-hSER [Å/min] | 145 | 145 | 94 |
| Oxide-MRR [Å/min] | 107 | 9 | 0 |
| Ratio Ge-MRR to Oxide-MRR | 7 | 84 | — |

TABLE 3

Ge-Hot static etching rates [Å/min] of selected compounds (B)

| Compound | Ge-hSER [Å/min] |
| --- | --- |
| B4 | 128 |
| B1 | 93 |
| B4 | 144 |
| B9 | 227 |
| B3 | 145 |
| B2 | 195 |
| B5 | 211 |
| B7 | 94 |
| B8 | 109 |
| B10 | 34 |
| B15 | 45 |
| B14 | 65 |
| B9 | 228 |
| B13 | 8 |

TABLE 4

CMP compositions of the examples 11 to 16, their pH values, Ge-cSER, Ge-hSER data as well as their Ge-MRR and oxide-MRR data in the process of chemical-mechanical polishing structured silicon germanium wafers using these compositions, wherein the aqueous medium (C) of the CMP compositions is de-ionized water. The amounts of the components (A), (B), (D) are specified in weight percent (wt. %) by weight of the corresponding CMP composition. If the amounts of the components other than (C) are in total y % by weight of the CMP composition, then the amount of (C) is (100 − y) % by weight of the CMP composition.

|  | Example 11 | Example 12 |
| --- | --- | --- |
| Particles (A) | A1 1.5 wt. % | A1 1.5 wt. % |
| Oxidizing agent (D) | $H_2O_2$ 0.75 wt. % | $H_2O_2$ 0.75 wt. % |
| Organic compound (B) | B1 0.1 wt. % | B1 0.1 wt. % |
| pH | 3 | 4 |
| Ge-MRR [Å/min] | 1214 | 869 |
| Ge-hSER [Å/min] | 73 | 94 |
| Oxide-MRR [Å/min] | 18 | 12 |
| Ratio Ge-MRR to Oxide-MRR | 66 | 72 |

|  | Example 13 | Example 14 | Example 15 | Example 16 |
| --- | --- | --- | --- | --- |
| Particles (A) | A1 2.5 wt. % | A1 1.5 wt. % | A1 1.5 wt. % | A1 2.5 wt. % |
| Oxidizing agent (D) | $H_2O_2$ 0 wt. % | $H_2O_2$ 0.75 wt. % | $H_2O_2$ 2.5 wt. % | $H_2O_2$ 0.75 wt. % |

| | | | | |
|---|---|---|---|---|
| Organic compound (B) | B1 0.1 wt % | B1 0.1 wt % | B1 0.1 wt % | B1 0.1 wt % |
| pH | 4 | 4 | 4 | 4 |
| $Si_{0.6}Ge_{0.4}$-MRR [Å/min] | 379 | 41 | 35 | 254 |

The CMP compositions according to the invention are showing an improved polishing performance in terms of germanium to oxide selectivity and a drastic decrease in the etching rates as can be demonstrated by the examples shown in table 2, table 3 and table 4.

The invention claimed is:

1. A chemical mechanical polishing (CMP) composition (Q), comprising:
   (A) cocoon-shaped silica particles;
   (B) a compound or salt of formula (I) having at least one polymeric polyether chain:

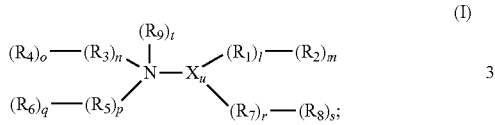

(I)

wherein:
   X is $CH_2N$, $CH_2CH_2N$, $CH_2CH_2CH_2N$, $CH_2CH_2CH_2CH_2N$, CH, $CH_2$, $CH_2CH$, $CH_2CH_2CH$, C=O, or $CH_2CH_2O$, wherein X is bonded by the carbon atom of the respective group to the nitrogen;
   $R_1$, $R_2$, $R_3$, $R_4$, $R_5$, $R_6$, $R_7$, $R_8$, and $R_9$ are each independently $O^-$, H, OH, $COO^-$, COONa, CH, $CH_2$, $CH_3$, $CH_2CH_3$, $C_1$-$C_{20}$-alkyl, $C_2$-$C_{20}$-alkenyl with at least one carbon carbon double bond, $C_1$-$C_{20}$-alkyl-acyl, $C_2$-$C_{20}$-alkenyl-acyl, $CH_2CH_2OH$, OHCHCHOH, $CH_2COO^-$, $CH_2COONa$, $CH_2CH_2O$, or $CH_2CH(CH_3)O$;
   u is 1;
   t is 0 or 1;
   l, m, o, q, and s are each independently an integer within a range of from 0 to 500; and
   n, p, and r are each independently an integer within a range of from 1 to 500;
   with the proviso that when X is $CH_2$, C=O, or $CH_2CH_2O$, then l and m are zero, and when X is $CH_2N$, $CH_2CH_2N$, $CH_2CH_2CH_2N$, $CH_2CH_2CH_2CH_2N$, CH, $CH_2CH$, $CH_2CH_2CH$, then l is at least one; and
   (C) an aqueous medium,
wherein the composition (Q) has a pH of from 2 to 6.

2. The CMP composition (Q) according to claim 1, wherein, in formula (I):
   X is $CH_2N$, $CH_2CH_2N$, $CH_2CH_2CH_2N$, or $CH_2CH_2CH_2CH_2N$, and bonded to the nitrogen by a carbon atom of the terminal $CH_2$;
   $R_1$, $R_2$, $R_3$, $R_4$, $R_5$, $R_6$, $R_7$, and $R_8$ are each independently $CH_2CH_2O$ or $CH_2CH(CH_3)O$ forming a polyether; and
   t is 0, wherein a last oxyalkylene group of the polyether chain has a hydroxy function.

3. The CMP composition (Q) according to claim 2, wherein, in formula (I):
   the number of $CH_2CH_2O$ groups in the polyether ranges from 1 to 300; and
   the number of $CH_2CH(CH_3)O$ groups ranges from 1 to 500.

4. The CMP composition (Q) according to claim 1, wherein, in formula (I):
   X is $CH_2CH_2N$, and bonded to the nitrogen by the carbon atom of the terminal $CH_2$;
   $R_1$, $R_3$, $R_5$ and $R_7$ are $CH_2CH(CH_3)O$;
   m, l, n, o, p, q, r, and s are 1;
   t is 0; and
   $R_2$, $R_4$, $R_6$, and $R_8$ are hydrogen.

5. The CMP composition (Q) according to claim 1, wherein, in formula (I):
   X is $CH_2CH_2O$, and bonded to the nitrogen by the carbon atom of the terminal $CH_2$ of the $CH_2CH_2O$;
   $R_3$, $R_4$, $R_5$, $R_6$, $R_7$, and $R_8$ are each independently $CH_2CH_2O$ or $CH_2CH(CH_3)O$ forming a polyether; and
   t is 0, and
   wherein a last oxyalkylene group of the polyether chain has a hydroxy function.

6. The CMP composition (Q) according to claim 5, wherein the number of $CH_2CH_2O$ groups in the polyether ranges from 1 to 50 and the number of $CH_2CH(CH_3)O$ groups is in the range of from 1 to 100.

7. The CMP composition (Q) according to claim 1, wherein, in formula (I):
   X is C=O, and bonded to the nitrogen by the carbon atom of the carbonyl group forming an amide;
   $R_3$ is H, $CH_2CH_2O$, or $CH_2CH(CH_3)O$, with the proviso that when $R_3$ is H, then n is 1 and o is 0, and when $R_3$ is $CH_2CH_2O$ or $CH_2CH(CH_3)O$, then $R_4$ is H and o is 1;
   $R_5$ is $CH_2CH_2O$ or $CH_2CH(CH_3)O$;
   $R_6$ is H;
   $R_7$ and $R_8$ are independently from each other $C_1$-$C_{20}$-alkyl or $C_2$-$C_{20}$-alkenyl with at least one carbon carbon double bond; and
   t is 0.

8. The CMP composition (Q) according to claim 1, wherein in formula (I):
   X is $CH_2$, $CH_2N$, $CH_2CH_2N$, or $CH_2CH_2CH_2N$, and bonded to the nitrogen by a carbon atom of the terminal $CH_2$, with the proviso that when X is $CH_2$, then l is 0 and m is 0, and when X is $CH_2N$, $CH_2CH_2N$, or $CH_2CH_2CH_2N$, then l is 1, m is 0, and $R_1$ is H;
   $R_3$ is $CH_2$, $CH_3$, or $CH_2CH_2O$, with the proviso that when $R_3$ is $CH_3$, then n is 1 and o is 0, and when $R_3$ is $CH_2$ or $CH_2CH_2O$, then n is an integer from 1 to 4 and o is 1, and $R_4$ is OH or $CH_2COONa$;
$R_5$ is $CH_2COO^-$ or $H_2COONa$
p is 1;
q is 0;
$R_7$ is $C_8$-$C_{16}$-alkyl or $C_1$-$C_{16}$-acyl;
r is 1;
s is 0,
$R_9$ is $O^-$, $CH_3$, or $CH_2CH_3$; and
t is 1.

9. The CMP composition (Q) according to claim 1, wherein, in formula (I):
X is $CH_2CH$ or $CH_2CH_2CH$, and bonded to the nitrogen by the carbon atom of the terminal $CH_2$, or X is C=O, and bonded to the nitrogen by the carbon atom of the carbonyl group, with the proviso that when X is C=O, then l is 0, m is 0, r is 1, s is 0, and $R_7$ is a $C_8$-$C_{16}$-alkyl or $C_8$-$C_{16}$-alkenyl with at least one carbon carbon double bond, and when X is $CH_2CH$ or $CH_2CH_2CH$, then l is 1, m is 0, r is 1, s is 0, and $R_7$ is OH;
$R_1$ is $C_8$-$C_{16}$-alkyl or $C_8$-$C_{16}$-alkenyl with at least one carbon carbon double bond;
$R_3$ is $CH_2$;
n is an integer from 1 to 4;
$R_4$ is —OH;
o is 1;
$R_5$ is $CH_2$ or $CH_3$, with the proviso that when $R_5$ is $CH_3$, then p is 1 and q is 0, and when $R_5$ is $CH_2$, then p is an integer from 1 to 4, $R_6$ is OH, and q is 1;
$R_9$ is $CH_3$ or $CH_2CH_3$; and
t is 1.

10. The CMP composition (Q) according to claim 1, wherein in formula (I):
X is CH;
$R_1$ is $CH_2$;
l is an integer from 1 to 4;
$R_2$ is OH;
m is 1;
$R_3$ is H or $CH_2CH_2O$, with the proviso that when $R_3$ is H, then n is 1 and o is 0, and when $R_3$ is $CH_2CH_2O$, then n is an integer from 1 to 4 and o is 1, and $R_4$ is $C_8$-$C_{16}$-alkyl, $C_8$-$C_{16}$-acyl, or $C_8$-$C_{16}$-alkenyl with at least one carbon carbon double bond;
$R_5$ is H or $CH_2CH_2O$, with the proviso that when $R_5$ is H, then p is 1 and q is 0, and when $R_5$ is $CH_2CH_2O$, then p is an integer from 1 to 4, q is 1, and $R_6$ is $C_8$-$C_{16}$-alkyl, $C_8$-$C_{16}$-acyl, or $C_8$-$C_{16}$-alkenyl with at least one carbon carbon double bond;
$R_7$ is H, CHOH, HOCHCHOH, r is 1 and $R^8$ is $C_4$-$C_{16}$-alkyl, s is 1
$R_9$ is $CH_3$;
t is 1; and
the anion is $Cl^-$, $Br^-$, $I^-$ or $[CH_3OSO_2]^-$.

11. The CMP composition (Q) according to claim 1, wherein the CMP composition (Q) further comprises (D) an oxidizing agent.

12. A method, comprising:
chemical mechanical polishing of a substrate (S) used in the semiconductor industry with the CMP composition (Q) of claim 1.

13. The method according to claim 12, wherein the substrate (S) comprises:
(i) elemental germanium; or
(ii) $Si_{1-x}Ge_x$ with $0.1 \leq x < 1$.

14. The method of claim 13, wherein the elemental germanium is grown in trenches between the STI (shallow-trench isolation) silicon dioxide.

15. A process for the manufacture of a semiconductor device, the process comprising chemical mechanical polishing of a substrate (S) used in the semiconductor industry in the presence of the CMP composition (Q) of claim 1.

16. The process according to claim 15, wherein the substrate (S) comprises:
(i) elemental germanium; or
(ii) $Si_{1-x}Ge_x$ with $0.1 \leq x < 1$.

* * * * *

UNITED STATES PATENT AND TRADEMARK OFFICE
CERTIFICATE OF CORRECTION

PATENT NO. : 10,227,506 B2
APPLICATION NO. : 15/536447
DATED : March 12, 2019
INVENTOR(S) : Max Siebert et al.

It is certified that error appears in the above-identified patent and that said Letters Patent is hereby corrected as shown below:

In the Specification

Column 4, Line 61, "7" should read -- $\eta$ --;

Column 6, Line 50, "$C_5H_g$," should read -- $C_5H_9$, --;

Column 6, Line 55, "$C_3H$-acyl, $C_4H_7$-acyl," should read -- $C_3H_6$-acyl, $C_4H_8$-acyl, --;

Column 6, Line 55, "$CH_{12}$-acyl," should read -- $C_6H_{12}$-acyl, --;

Column 6, Line 64, "$C_1H_{30}$-acyl," should read -- $C_{16}H_{30}$-acyl, --;

Column 8, Lines 1-2, "$C_8$-$C_{18}$-alkenyl" should read -- $C_8$-$C_{16}$-alkenyl --;

Column 8, Line 62, "$C_1$-$C_{20}$-alkenyl-acyl," should read -- $C_2$-$C_{20}$-alkenyl-acyl, --;

Column 9, Lines 4-5, "$C_4$-$C_{18}$-alkyl, $C_4$-$C_{18}$-alkenyl" should read -- $C_4$-$C_{16}$-alkyl, $C_4$-$C_{16}$-alkenyl --;

Column 9, Line 10, "$C_1$-$C_{20}$-alkenyl-acyl," should read -- $C_2$-$C_{20}$-alkenyl-acyl, --;

Column 9, Line 47, "R7" should read -- $R^7$ --;

Column 9, Line 52, "R7" should read -- $R^7$ --;

Column 9, Line 57, "$C_2$-$C_2$-alkenyl" should read -- $C_2$-$C_{20}$-alkenyl --;

Column 10, Line 27, "$C_8$-$C_{16}$-alkenyl" should read -- $C_5$-$C_{18}$-alkenyl --;

Column 10, Line 43, "$C_2$-$C_2$-alkenyl" should read -- $C_2$-$C_{20}$-alkenyl --;

Signed and Sealed this
Eleventh Day of February, 2020

Andrei Iancu
*Director of the United States Patent and Trademark Office*

CERTIFICATE OF CORRECTION (continued)
U.S. Pat. No. 10,227,506 B2

Column 11, Lines 2-3, "$C_8$-$C_{18}$-alkyl-acyl, $C_8$-$C_{18}$-alkenyl-acyl," should read -- $C_8$-$C_{16}$-alkyl-acyl, $C_8$-$C_{16}$-alkenyl-acyl, --;

Column 11, Line 11, "$C_4$-$C_{18}$-alkyl, $C_4$-$C_{18}$-alkenyl" should read -- $C_4$-$C_{16}$-alkyl, $C_4$-$C_{16}$-alkenyl --;

Column 16, Line 4, "hystidine," should read -- histidine, --;

Column 23, Line 34, "10 mmol/KCl" should read -- 10 mmol/l KCl --;

In the Claims

Column 28, Line 27, Claim 4, "$R_5$" should read -- $R_5$, --;

Column 29, Line 6, Claim 8, "$C_1$-$C_{16}$-acyl;" should read -- $C_8$-$C_{16}$-acyl; --; and Column 30, Line 11, Claim 10, "$R^8$" should read -- $R_8$ --.